United States Patent
Umemoto et al.

(10) Patent No.: US 11,990,873 B2
(45) Date of Patent: May 21, 2024

(54) RADIO-FREQUENCY POWER-AMPLIFYING ELEMENT

(71) Applicant: Murata Manufacturing Co., Ltd., Kyoto-fu (JP)

(72) Inventors: Yasunari Umemoto, Nagaokakyo (JP); Shaojun Ma, Nagaokakyo (JP); Shigeki Koya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 681 days.

(21) Appl. No.: 17/168,904

(22) Filed: Feb. 5, 2021

(65) Prior Publication Data

US 2021/0257973 A1      Aug. 19, 2021

(30) Foreign Application Priority Data

Feb. 19, 2020    (JP) ................................. 2020-026220

(51) Int. Cl.
  *H03F 1/30*    (2006.01)
  *H03F 3/19*    (2006.01)
  *H03F 3/21*    (2006.01)

(52) U.S. Cl.
  CPC .............. *H03F 1/302* (2013.01); *H03F 3/19* (2013.01); *H03F 3/211* (2013.01); *H03F 2200/451* (2013.01)

(58) Field of Classification Search
  CPC ............. H03F 1/302; H03F 3/19; H03F 3/211
  USPC ................................................ 330/307, 250
  See application file for complete search history.

(56) References Cited

U.S. PATENT DOCUMENTS

| | | | | |
|---|---|---|---|---|
| 11,791,782 B2* | 10/2023 | Kondo | ................... | H03F 3/213 |
| | | | | 330/307 |
| 2003/0157745 A1* | 8/2003 | Zeghbroeck | ............ | H01L 29/73 |
| | | | | 257/E29.174 |
| 2006/0138460 A1* | 6/2006 | Sasaki | ................ | H01L 29/7304 |
| | | | | 257/E29.189 |
| 2006/0223484 A1* | 10/2006 | Maeda | ...................... | H03F 3/19 |
| | | | | 455/333 |

(Continued)

FOREIGN PATENT DOCUMENTS

| | | |
|---|---|---|
| JP | 2006-313881 A | 11/2006 |
| WO | 02/056461 A1 | 7/2002 |
| WO | 2012/120796 A1 | 9/2012 |

*Primary Examiner* — Patricia T Nguyen
(74) *Attorney, Agent, or Firm* — Studebaker & Brackett PC

(57) ABSTRACT

A first amplifier circuit in a preceding stage, a second amplifier circuit in a subsequent stage, and a ground external connection terminal are disposed on a substrate. The first and second amplifier circuits each include bipolar transistors, capacitive elements for the respective bipolar transistors, and resistive elements for the respective bipolar transistors. The bipolar transistors each include separate base electrodes, that is, a first base electrode for radio frequency and a second base electrode for biasing. The bipolar transistors of the second amplifier circuit include emitter electrodes connected to the ground external connection terminal. The minimum spacing between the first base electrode and an emitter mesa layer of at least one of the bipolar transistors of the second amplifier circuit is greater than the minimum spacing between the first base electrode and am emitter mesa layer of each of the bipolar transistors of the first amplifier circuit.

10 Claims, 14 Drawing Sheets

(56) References Cited

U.S. PATENT DOCUMENTS

| | | | |
|---|---|---|---|
| 2006/0249752 A1* | 11/2006 | Asano | H01L 29/812 257/E29.189 |
| 2018/0269206 A1 | 9/2018 | Obu et al. | |
| 2019/0181251 A1* | 6/2019 | Dutta | H01L 29/66242 |
| 2019/0356281 A1 | 11/2019 | Honda et al. | |
| 2020/0091874 A1* | 3/2020 | Sasaki | H03F 3/195 |
| 2023/0318543 A1* | 10/2023 | Koya | H01L 29/1004 330/307 |

* cited by examiner

RADIO-FREQUENCY POWER-AMPLIFYING ELEMENT

CROSS-REFERENCE TO RELATED APPLICATION

This application claims benefit of priority to Japanese Patent Application No. 2020-026220, filed Feb. 19, 2020, the entire content of which is incorporated herein by reference.

BACKGROUND

Technical Field

The present disclosure relates to a radio-frequency power-amplifying element.

Background Art

Heterojunction bipolar transistors (HBTs) find use as radio-frequency power-amplifying elements for mobile communications. Japanese Unexamined Patent Application Publication No. 2006-313881 discloses a radio-frequency power-amplifying element that is proof against thermal runaway. The radio-frequency power-amplifying element disclosed in Japanese Unexamined Patent Application Publication No. 2006-313881 has a two-stage configuration including an input-stage amplifier circuit and an output-stage amplifier circuit. The output-stage amplifier circuit includes bipolar transistors connected in parallel. The bipolar transistors each include an emitter layer, a direct-current (DC) base electrode, and a radio-frequency (RF) base electrode that are disposed on a base layer. The DC base electrode is supplied with DC bias, and the RF base electrode is supplied with radio-frequency signals. Each bipolar transistor also includes an emitter electrode disposed on the emitter layer.

The emitter electrode is interposed between the DC base electrode and the RF base electrode. The distance between the emitter electrode and the DC base electrode is substantially greater than the distance between the emitter electrode and the RF base electrode. As the distance between the emitter electrode and the DC base electrode increases, the base resistance inserted into a current path to which base bias is applied increases correspondingly.

Unbalanced flow of electric current through the bipolar transistors of the output-stage amplifier circuit causes temperature increase in a bipolar transistor in which the DC component of current is larger than the DC component of current flowing through any other bipolar transistor in the output-stage amplifier circuit. Bipolar transistors typically have positive temperature coefficients. Due to increased temperature, electric current concentrates in a specific bipolar transistor, which eventually exhibits thermal runaway. As mentioned previously, the radio-frequency power-amplifying element disclosed in Japanese Unexamined Patent Application Publication No. 2006-313881 involves increased base resistance, which is conducive to eliminating or reducing the occurrence of thermal runaway resulting from unbalanced flow of current through the bipolar transistors.

In recent years, attention is being given to envelope tracking, in which the collector voltage varies as the amplitude of an input signal varies, and there is a growing need for radio-frequency power-amplifying element operable at high collector voltages. Radio-frequency power-amplifying elements mostly have a multistage configuration including an input-stage amplifier circuit and an output-stage amplifier circuit. Such a radio-frequency power-amplifying element requires the output-stage amplifier circuit to include bipolar transistors that have a higher breakdown withstand voltage so as to remain operable at high collector voltages placed upon application of a radio-frequency signal of increased amplitude.

The configuration of the radio-frequency power-amplifying element disclosed in Japanese Unexamined Patent Application Publication No. 2006-313881 is conducive to eliminating or reducing the occurrence of thermal runaway resulting from a disparity in the DC component of collector current flowing through the bipolar transistors; however, the configuration may be ineffective in terms of prevention of breakdown that would be caused by unbalanced flow of collector current upon application of a radio-frequency signal of increased amplitude. Such an increase in the amplitude of a radio-frequency signal is likely to cause electric current to concentrate in a specific bipolar transistor especially when an output impedance mismatch is created due to a reduction in load impedance.

SUMMARY

Accordingly, the present disclosure provides a radio-frequency power-amplifying element that has a higher breakdown withstand voltage so as to be operable for an input signal of increased amplitude.

According to an aspect of the present disclosure, a radio-frequency power-amplifying element includes a substrate and a first amplifier circuit and a second amplifier circuit. The first and second amplifier circuits are disposed on the substrate. The first amplifier circuit includes at least one bipolar transistor, and the second amplifier circuit includes a plurality of bipolar transistors. The at least one bipolar transistor of the first amplifier circuit and the plurality of bipolar transistors of the second amplifier circuit each include a collector layer on the substrate, a base layer on the collector layer, an emitter layer on the base layer, an emitter mesa layer on the emitter layer, an emitter electrode, a first base electrode, and a second base electrode. The emitter electrode is connected to the emitter layer through the emitter mesa layer. The first and second base electrodes are disposed on the base layer and connected to the base layer. The first base electrode is supplied with radio-frequency signals, and the second base electrode is supplied with base bias. The emitter mesa layer, the first base electrode, and the second base electrode of the at least one bipolar transistor of the first amplifier circuit do not overlap each other when viewed in plan. The emitter mesa layer, the first base electrode, and the second base electrode of each of the plurality of bipolar transistors of the second amplifier circuit do not overlap each other when viewed in plan. The minimum spacing between the first base electrode and the emitter mesa layer of at least one of the plurality of bipolar transistors of the second amplifier circuit is greater than the minimum spacing between the first base electrode and the emitter mesa layer of the at least one bipolar transistor of the first amplifier circuit.

According to another aspect of the present disclosure, a radio-frequency power-amplifying element includes a substrate and a first amplifier circuit and a second amplifier circuit. The first and second amplifier circuits are disposed on the substrate. The first amplifier circuit includes at least one bipolar transistor, and the second amplifier circuit includes a plurality of bipolar transistors. The at least one bipolar transistor of the first amplifier circuit and the plurality of bipolar transistors of the second amplifier circuit each include a collector layer on the substrate, a base layer on the collector layer, an emitter layer on the base layer, an emitter mesa layer on the emitter layer, an emitter electrode, and a base electrode. The emitter electrode is connected to the emitter layer through the emitter mesa layer. The base electrode is disposed on the base layer and connected to the base layer. The emitter mesa layer and the base electrode of the at least one bipolar transistor of the first amplifier circuit do not overlap each other when viewed in plan. The emitter mesa layer and the base electrode of each of the plurality of bipolar transistors of the second amplifier circuit do not overlap each other when viewed in plan. The minimum spacing between the base electrode and the emitter mesa layer of at least one of the plurality of bipolar transistors of the second amplifier circuit is greater than the minimum spacing between the base electrode and the emitter mesa layer of the at least one bipolar transistor of the first amplifier circuit.

Other features, elements, characteristics, and advantages of the present disclosure will become more apparent from the following detailed description of preferred embodiments of the present disclosure with reference to the attached drawings.

DETAILED DESCRIPTION

First Example

The following describes a radio-frequency power-amplifying element in a first example with reference to FIGS. 1 to 5.

Figure 1:
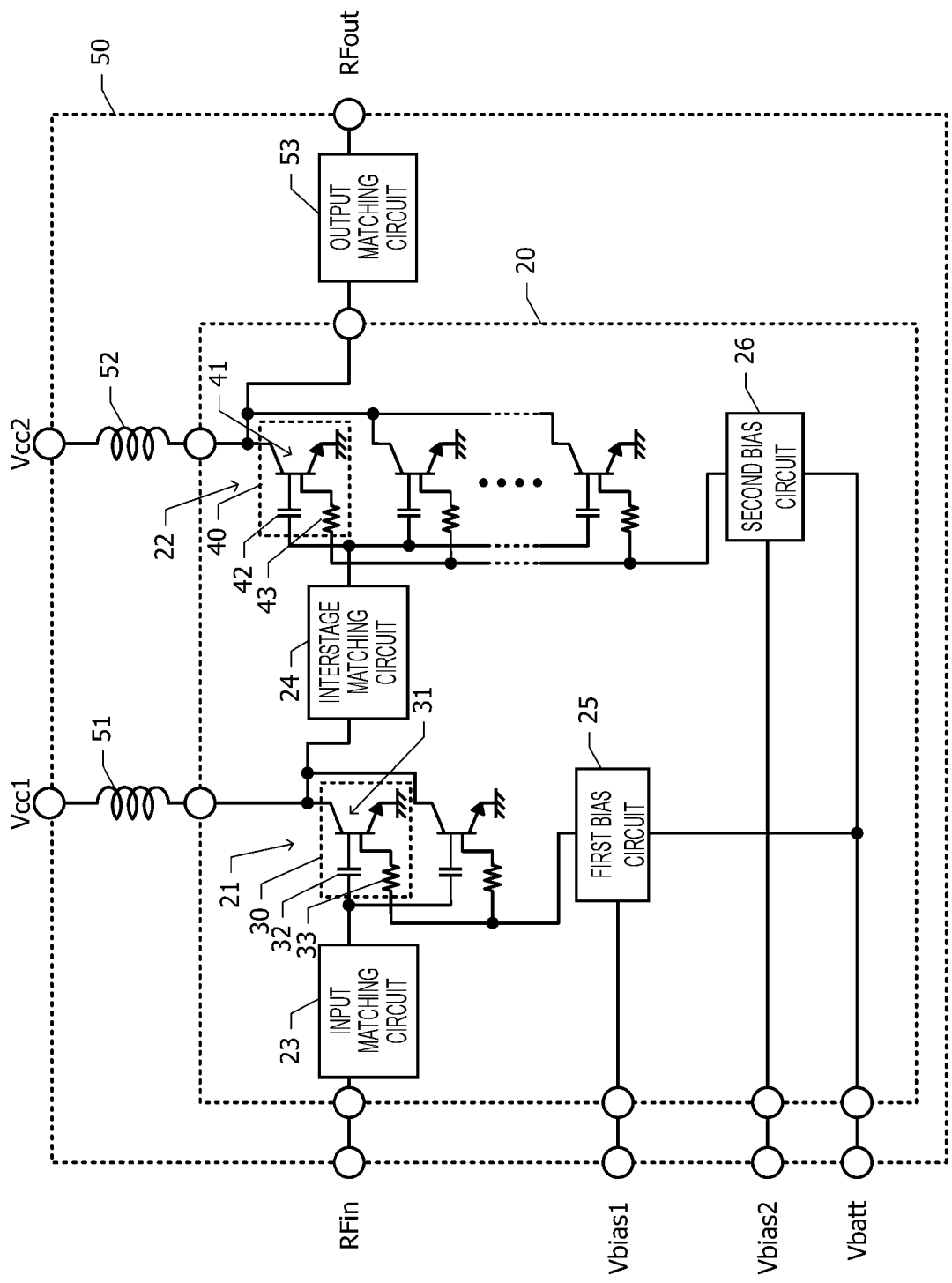
FIG. 1 is an equivalent circuit diagram of a power-amplifying module including a radio-frequency power-amplifying element in a first example.

FIG. 1 is an equivalent circuit diagram of a power-amplifying module 50 including a radio-frequency power-amplifying element 20 in the first example. The power-amplifying module 50 includes the radio-frequency power-amplifying element 20, an inductor 51, an inductor 52, an output matching circuit 53. The radio-frequency power-amplifying element 20 is a monolithic microwave integrated circuit (MMIC). The inductors 51 and 52 and the output matching circuit 53 are connected to the radio-frequency power-amplifying element 20. The radio-frequency power-amplifying element 20 includes a first amplifier circuit 21, a second amplifier circuit 22, an input matching circuit 23, an interstage matching circuit 24, a first bias circuit 25, and a second bias circuit 26. The first amplifier circuit 21 and the second amplifier circuit 22 are also referred to as an input-stage amplifier circuit and an output-stage amplifier circuit, respectively.

Radio-frequency signals are input to an input terminal RFin and are then input to the first amplifier circuit 21 through the input matching circuit 23. The radio-frequency signals are amplified by the first amplifier circuit 21 and are then input to the second amplifier circuit 22 through the interstage matching circuit 24. The radio-frequency signals are amplified by the second amplifier circuit 22 and are then output to an output terminal RFout through the output matching circuit 53.

Voltage for biasing is applied to the first bias circuit 25 and the second bias circuit 26 through a bias power supply terminal Vbatt. The first bias circuit 25 applies bias voltage or bias current to the first amplifier circuit 21 in accordance with a first bias control signal that is input through a first bias control terminal Vbias1. The second bias circuit 26 applies bias voltage or bias current to the second amplifier circuit 22 in accordance with a second bias control signal that is input through a second bias control terminal Vbias2.

Power supply voltage provided at a power supply voltage terminal Vcc1 is applied to the first amplifier circuit 21 through the inductor 51. Power supply voltage provided at a power supply voltage terminal Vcc2 is applied to the second amplifier circuit 22 through the inductor 52.

The first amplifier circuit 21 includes two unitary cells 30, which are connected in parallel. The unitary cells 30 each include a bipolar transistor 31, a capacitive element 32, and a resistive element 33. Referring to circuit symbols used for the bipolar transistor 31 in FIG. 1, the capacitive element 32 and the resistive element 33 are connected individually to the bipolar transistor 31. The circuit diagram implies that within the bipolar transistor 31, base electrodes connected with the capacitive element 32 are separated from a base electrode connected with the resistive element 33. This will be described later with reference to FIG. 2A. The bipolar transistors 31 are, for example, heterojunction bipolar transistors (HBTs).

The bipolar transistors 31 each have a base connected to the input matching circuit 23 via the capacitive element 32 and connected to the first bias circuit 25 via the resistive element 33. The base of each of the bipolar transistors 31 is supplied with radio-frequency signals through the input matching circuit 23 and the capacitive element 32. The base of each of the bipolar transistor 31 is also supplied with bias current sent from the first bias circuit 25 through the resistive element 33.

The bipolar transistors 31 each have a collector connected to the power supply voltage terminal Vcc1 via the inductor 51. The collector of each of the bipolar transistors 31 is also connected to the interstage matching circuit 24.

The second amplifier circuit 22 includes unitary cells 40, which are connected in parallel. The unitary cells 40 each include a bipolar transistor 41, a capacitive element 42, and a resistive element 43. The second amplifier circuit 22 is structurally similar to the first amplifier circuit 21; that is, within the bipolar transistor 41, base electrodes connected with the capacitive element 42 are separated from a base electrode connected with the resistive element 43.

The bipolar transistors 41 each have a base connected to the interstage matching circuit 24 via the capacitive element 42 and connected to the second bias circuit 26 via the resistive element 43. The base of each of the bipolar transistor 41 is supplied with radio-frequency signals through the interstage matching circuit 24 and the capacitive element 42. The base of each of the bipolar transistor 41 is also supplied with bias current sent from the second bias circuit 26 through the resistive element 43.

The bipolar transistors 41 each have a collector connected to the power supply voltage terminal Vcc2 via the inductor 52. The collector of each of the bipolar transistor 41 is also connected to the output matching circuit 53.

Figure 2A:
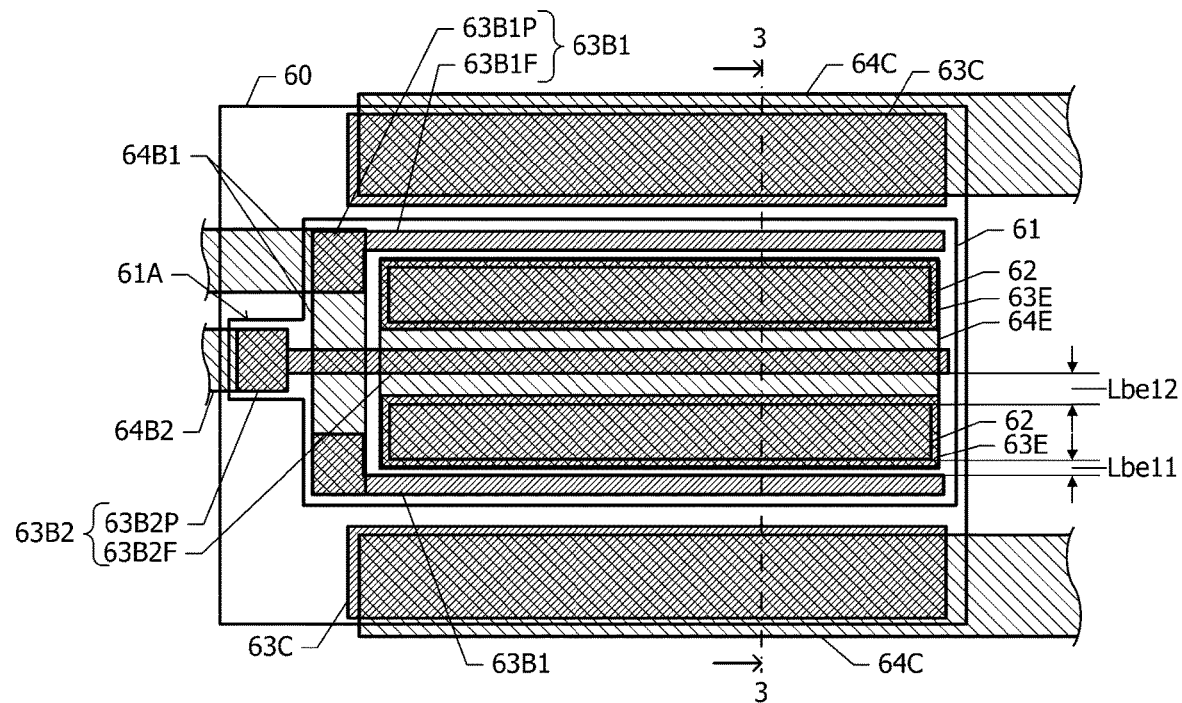
FIG. 2A illustrates a planar layout of constituent components of one of bipolar transistors included in a first amplifier circuit of the radio-frequency power-amplifying element in the first example.
Figure 2B:
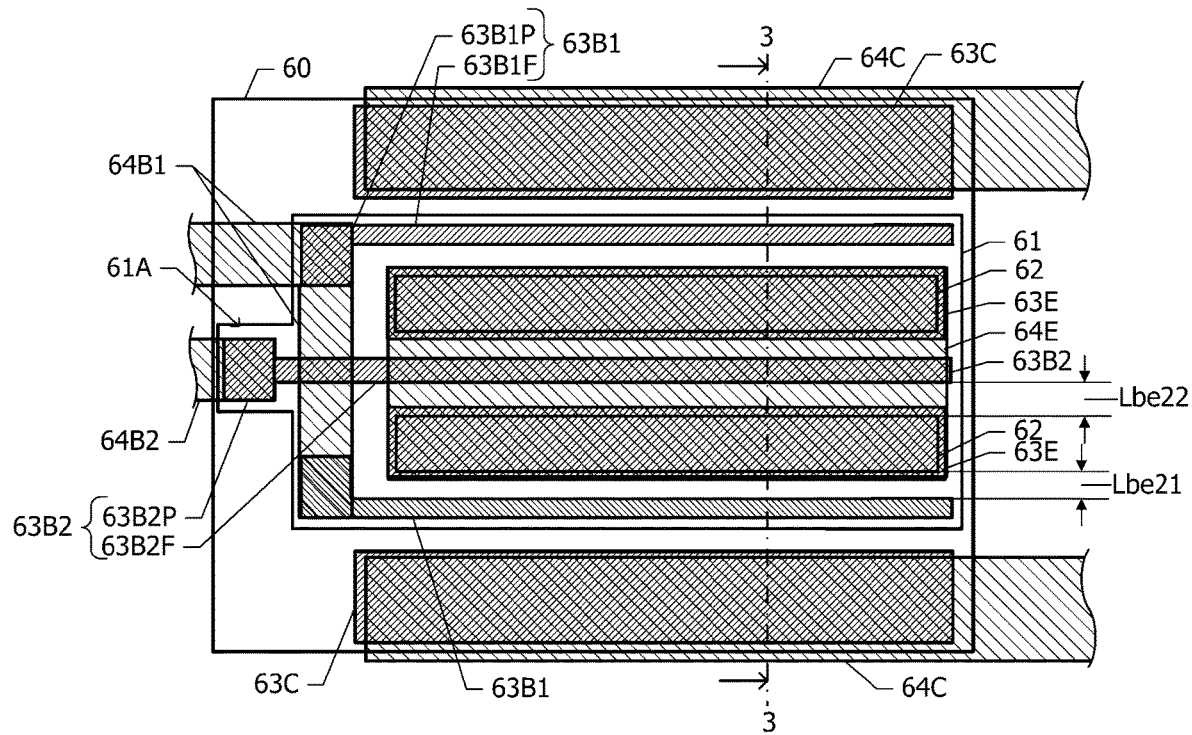
FIG. 2B illustrates a planar layout of constituent components of one of bipolar transistors included in a second amplifier circuit of the radio-frequency power-amplifying element in the first example.

FIG. 2A illustrates a planar layout of constituent components of one of the bipolar transistors 31 included in the first amplifier circuit 21 of the radio-frequency power-amplifying element 20 (see FIG. 1) in the first example. FIG. 2B illustrates a planar layout of constituent components of one of the bipolar transistors 41 included in the second amplifier circuit 22 of the radio-frequency power-amplifying element 20 (see FIG. 1) in the first example.

Referring to FIGS. 2A and 2B, emitter electrodes 63E, collector electrodes 63C, first base electrodes 63B1, a second base electrode 63B2 are densely hatched with lines slanting up from left to right, whereas an emitter line 64E, collector extended lines 64C, a first base extended line 64B1, and a second base extended line 64B2 are less densely hatched with lines slanting down from left to right. Contact holes extending from an upper wiring layer to a lower wiring layer are omitted from FIGS. 2A and 2B.

Figure 3:
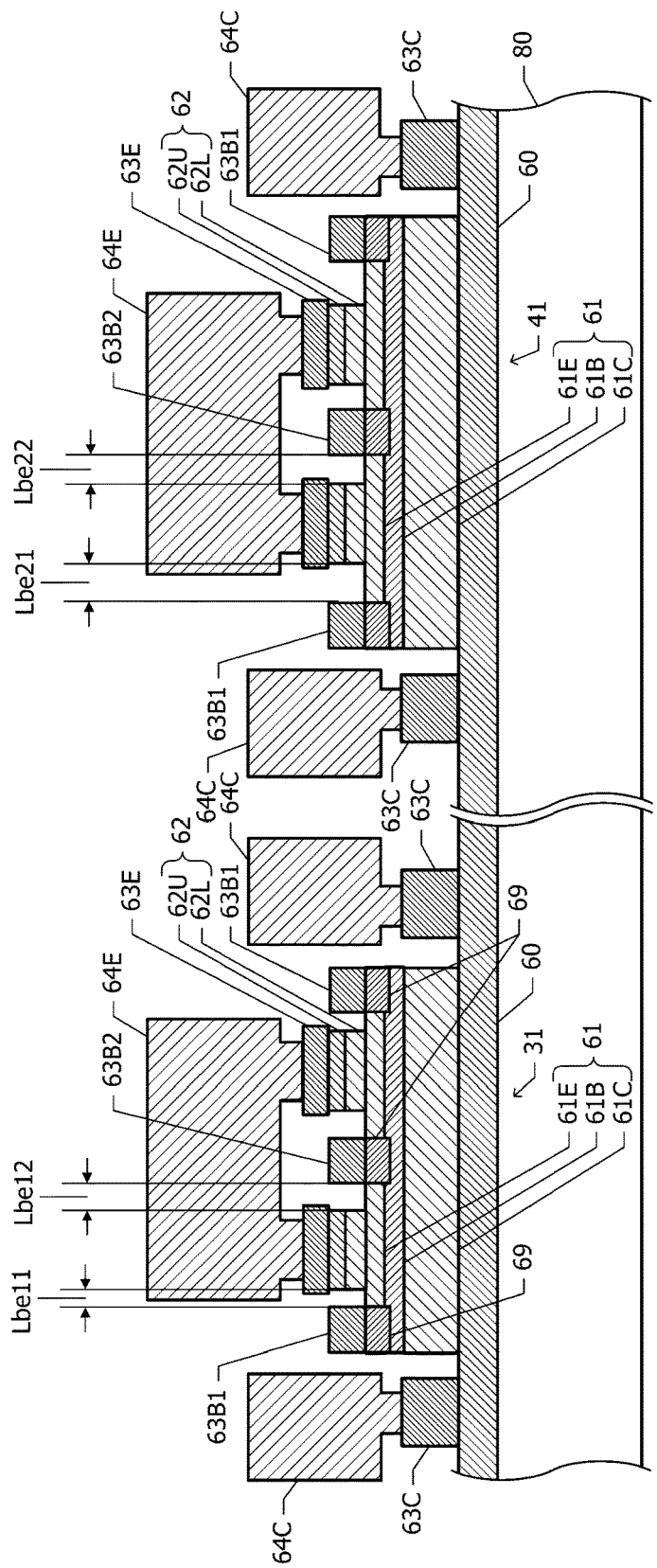
FIG. 3 is a sectional view taken along dash-dot line 3-3 in FIGS. 2A and 2B.

FIG. 3 is a sectional view taken along dash-dot line 3-3 in FIGS. 2A and 2B. The bipolar transistor 31 of the first amplifier circuit 21 is illustrated on the left side of FIG. 3, and the bipolar transistor 41 of the second amplifier circuit 22 is illustrated on the right side of FIG. 3.

The following describes the configuration of the bipolar transistor 31 of the first amplifier circuit 21 with reference to FIGS. 2A and 3.

Sub-collector layers 60 for the respective unitary cells 30 are provided in a surface layer portion of a substrate 80. Each of the sub-collector layers 60 is partially overlaid with a collector mesa layer 61. The collector mesa layer 61 is partially overlaid with two emitter mesa layers 62. The collector mesa layer 61 is located within the sub-collector layer 60 when viewed in plan. The collector mesa layer 61 is interposed between two collector electrodes 63C on the sub-collector layer 60. The two collector electrodes 63C are located within the sub-collector layer 60 when viewed in plan.

The collector mesa layer 61 includes a collector layer 61C on the substrate 80, a base layer 61B on the collector layer 61C, and an emitter layer 61E on the base layer 61B. Two first base electrodes 63B1, one second base electrode 63B2, and two emitter mesa layers 62 are located within the collector mesa layer 61 when viewed in plan. The emitter mesa layers 62 each include a cap layer 62L on the collector mesa layer 61 and a contact layer 62U on the cap layer 62L. When viewed in plan, the two emitter mesa layers 62 are strip-shaped and long in one direction and may be substantially rectangular. The two emitter mesa layers 62 are arranged side by side with a gap therebetween in a direction orthogonal to the longitudinal direction (i.e., in the width direction) in such a manner that long sides of the respective emitter mesa layers 62 are in parallel.

The two first base electrodes 63B1 each include a finger portion 63B1F, which is long in a direction parallel to the long sides of the emitter mesa layers 62. The second base electrode 63B2 includes a finger portion 63B2F, which is long in the direction parallel to the long sides of the emitter mesa layers 62. The finger portion 63B2F of the second base electrode 63B2 is interposed between the two emitter mesa layers 62. The finger portions 63B1F of the respective first base electrodes 63B1 are disposed on the collector mesa layer 61 in a manner so as to be closer than the two emitter mesa layers 62 to the respective outer sides of the collector mesa layer 61 in the width direction of the emitter mesa layers 62.

The first base electrodes 63B1 each include a pad portion 63B1P, which is joined to one end of the finger portion 63B1F. Each of the pad portions 63B1P is wider than the corresponding finger portion 63B1F. A gap is left between each of the pad portions 63B1P and an end portion of the corresponding emitter mesa layer 62 in the longitudinal direction of the emitter mesa layer 62. The two pad portions 63B1P are in positional agreement in the longitudinal direction of the emitter mesa layers 62.

Similarly, the second base electrode 63B2 includes a pad portion 63B2P, which is joined to one end of the finger portion 63B2F. The pad portion 63B2P of the second base electrode 63B2 is farther than the pad portions 63B1P of the first base electrodes 63B1 from the emitter mesa layers 62 in the longitudinal direction thereof. The collector mesa layer 61 includes a protruding portion 61A, which protrudes outward from the midsection of a side of a rectangular portion of the collector mesa layer 61. The pad portion 63B2P of the second base electrode 63B2 is located within the protruding portion 61A when viewed in plan.

The first base electrodes 63B1 and the second base electrode 63B2 are connected to the base layer 61B through an alloy layer 69 (see FIG. 3), which extends through the emitter layer 61E in the thickness direction. The alloy layer 69 is obtained by causing the material of the first base electrodes 63B1 and the second base electrode 63B2 to diffuse in the emitter layer 61E and to form an alloy.

The two emitter mesa layers 62 are overlaid with the respective emitter electrodes 63E. Each of the emitter electrodes 63E extends beyond the corresponding emitter mesa layer 62 when viewed in plan. In other words, each of the emitter mesa layers 62 is located within the corresponding emitter electrode 63E when viewed in plan. This structure is obtained through a self-align process, in which etching is performed to remove unwanted portions from the contact layers 62U and the cap layers 62L by using the emitter electrodes 63E as an etching mask. Each emitter electrode 63E is in ohmic contact with the contact layer 62U and is electrically connected to the emitter layer 61E through the emitter mesa layer 62.

Alternatively, the emitter layer 61E may be partially removed to leave a space for the first base electrodes 63B1 and the second base electrode 63B2, which are in turn in direct contact with the base layer 61B.

The collector electrodes 63C are disposed on the sub-collector layer 60 so as to be on opposite sides of the collector mesa layer 61 in the width direction of the emitter mesa layer 62. The collector electrodes 63C are in ohmic contact with the sub-collector layer 60 and are electrically connected to the collector layer 61C through the sub-collector layer 60.

Two collector extended lines 64C are disposed on the respective collector electrodes 63C. The collector extended lines 64C are disposed in a first wiring layer. Interlayer insulating films located between the first wiring layer and electrodes (e.g., the collector electrodes 63C and the emitter electrodes 63E) below the first wiring layer are omitted from FIG. 3. Each of the collector extended lines 64C is connected to the corresponding collector electrode 63C. The collector extended lines 64C lie over the respective collector electrodes 63C and extend in the longitudinal direction of the emitter mesa layers 62 beyond the sub-collector layer 60.

The emitter line 64E extends from one of the emitter electrodes 63E to the other emitter electrode 63E and lies above the finger portion 63B2F of the second base electrode 63B2. The emitter line 64E forms an electrical connection between the two emitter electrodes 63E.

The first base extended line 64B1 includes a portion that forms a connection between the two pad portions 63B1P of the respective first base electrodes 63B1. When viewed in plan, the first base extended line 64B1 extends beyond the sub-collector layer 60 in a direction opposite the direction in which the collector extended lines 64C extend. The portion being part of the first base extended line 64B1 and forming a connection between the two pad portions 63B1P intersects the finger portion 63B2F of the second base electrode 63B2. The first base extended line 64B1 and the second base electrode 63B2 are electrically isolated from each other at the intersection.

The pad portion 63B2P of the second base electrode 63B2 is connected to the second base extended line 64B2. The second base extended line 64B2 extends beyond the sub-collector layer 60 in the direction in which the first base extended line 64B1 extends.

Radio-frequency signals input through the input terminal RFin (see FIG. 1) are applied to the first base electrodes 63B1 (see FIG. 2A) through the capacitive element 32 and the first base extended line 64B1. Base bias from the first bias circuit 25 (see FIG. 1) is applied to the second base electrode 63B2 (see FIG. 2A) through the resistive element 33 and the second base extended line 64B2 (see FIG. 2A).

The following describes the materials and the dimensions of the constituent components of the bipolar transistor 31. Materials and dimensions other than those described below as examples are adoptable. The substrate 80 is, for example a semi-insulating GaAs substrate. The sub-collector layer 60 is an n-type GaAs layer doped with Si and having a thickness of not less than about 400 nm and not more than about 1,200 nm (i.e., from about 400 nm to about 1,200 nm). The Si-doping concentration is not less than about $2\times10^{18}$ $cm^{-3}$ and not more than about $4\times10^{18}$ $cm^{-3}$ (i.e., from about $2\times10^{18}$ $cm^{-3}$ to about $4\times10^{18}$ $cm^{-3}$). In place of Si, tellurium (Te) may be used as a dopant. Insulating properties are imparted, by injection of, for example, boron (B), oxygen (O), or helium (He), to a region that is part of the n-type GaAs layer and that is located outside the sub-collector layer 60 when viewed in plan.

The collector layer 61C is an n-type GaAs layer doped with Si and having a thickness of not less than about 500 nm and not more than about 2,000 nm (i.e., from about 500 nm to about 2,000 nm). The Si-doping concentration varies in the thickness direction.

The base layer 61B is a p-type GaAs layer doped with C and having a thickness of not less than about 50 nm and not more than about 150 nm (i.e., from about 50 nm to about 150 nm). The C-doping concentration is not less than about $1\times10^{19}$ $cm^{-3}$ and not more than about $5\times10^{19}$ $cm^{-3}$ (i.e., from about $1\times10^{19}$ $cm^{-3}$ to about $5\times10^{19}$ $cm^{-3}$). The sheet resistance of the base layer 61B is not less than about 130 n/sq and is not more than about 300 n/sq (i.e., from about 130 n/sq to about 300 n/sq). Instead of being a p-type GaAs layer, the base layer 61B may be a p-type InGaAs layer, a p-type GaAsSb layer, or a p-type InGaAsN layer.

The emitter layer 61E is an n-type InGaP layer doped with Si and having a thickness of not less than about 20 nm and not more than about 50 nm (i.e., from about 20 nm to about 50 nm). The Si-doping concentration is not less than about $2\times10^{17}$ $cm^{-3}$ and not more than about $5\times10^{17}$ $cm^{-3}$ (i.e., from about $2\times10^{17}$ $cm^{-3}$ to about $5\times10^{17}$ $cm^{-3}$).

The cap layer 62L is an n-type GaAs layer doped with Si and having a thickness of not less than about 50 nm and not more than about 200 nm (i.e., from about 50 nm to about 200 nm). The Si-doping concentration is not less than about $2\times10^{18}$ cm$^{-3}$ and not more than about $4\times10^{18}$ cm$^{-3}$ (i.e., from about $2\times10^{18}$ cm$^{-3}$ to about $4\times10^{18}$ cm$^{-3}$). The contact layer 62U is an n-type InGaAs layer doped with Si and having a thickness of not less than about 100 nm and not more than about 200 nm (i.e., from about 100 nm to about 200 nm). The Si-doping concentration is not less than about $1\times10^{19}$ cm$^{-3}$ and not more than about $3\times10^{19}$ cm$^{-3}$ (i.e., from about $1\times10^{19}$ cm$^{-3}$ to about $3\times10^{19}$ cm$^{-3}$).

The emitter mesa layers 62 each have a length of not less than about 5 μm and not more than about 60 μm (i.e., from about 5 μm to about 60 μm) and a width of not less than about 1 μm and not more than about 8 μm (i.e., from about 1 μm to about 8 μm). The minimum spacing between the finger portion 63B1F of each of the first base electrodes 63B1 and the corresponding emitter mesa layer 62 is denoted by Lbe11 and is not less than about 0.3 μm and not more than about 0.8 wn (i.e., from about 0.3 wn to about 0.8 μm). The minimum spacing between the finger portion 63B2F of the second base electrode 63B2 and each of the emitter mesa layers 62 is denoted by Lbe12 and is not less than about 0.3 μm and not more than about 2 μm (i.e., from about 0.3 μm to about 2 μm).

The configuration of the bipolar transistor 41 of the second amplifier circuit 22 is essentially identical to the configuration of the bipolar transistor 31 of the first amplifier circuit 21. Referring to FIGS. 2B and 3, each constituent component of the bipolar transistor 41 included in the second amplifier circuit 22 is denoted by the reference sign of the corresponding constituent component of the bipolar transistor 31 included in the first amplifier circuit 21.

Radio-frequency signals output from the first amplifier circuit 21 (see FIG. 1) are applied to the first base electrodes 63B1 (see FIG. 2B) through the capacitive element 42 (see FIG. 1) and the first base extended line 64B1 of the second amplifier circuit 22. Base bias from the second bias circuit 26 (see FIG. 1) is applied to the second base electrode 63B2 (see FIG. 2B) through the resistive element 43 and the second base extended line 64B2 of the second amplifier circuit 22.

The minimum spacing between the finger portion 63B1F of each of the first base electrodes 63B1 and the corresponding emitter mesa layer 62 in the bipolar transistor 41 of the second amplifier circuit 22 is denoted by Lbe21 and is greater than the minimum spacing Lbe11 in the bipolar transistor 31 of the first amplifier circuit 21. The minimum spacing Lbe21 is, for example, not less than about 0.8 μm and not more than about 2.5 μm (i.e., from about 0.8 μm to about 2.5 μm). The minimum spacing between the finger portion 63B2F of the second base electrode 63B2 and each of the emitter mesa layers 62 in the bipolar transistor 41 of the second amplifier circuit 22 is denoted by Lbe22 and is not less than about 0.3 μm and not more than about 2 μm (i.e., from about 0.3 μm to about 2 μm).

The spacing between the pad portion 63B1P of each of the first base electrodes 63B1 and the corresponding emitter mesa layer 62 is greater than the spacing between the finger portion 63B1F of each of the first base electrodes 63B1 and the corresponding emitter mesa layer 62. The minimum spacing Lbe11 between the finger portion 63B1F and the emitter mesa layer 62 may thus be regarded as the minimum spacing between the first base electrode 63B1 and the emitter mesa layer 62. The same holds true for the minimum spacings Lbe12, Lbe21, and Lbe22.

Figure 4:
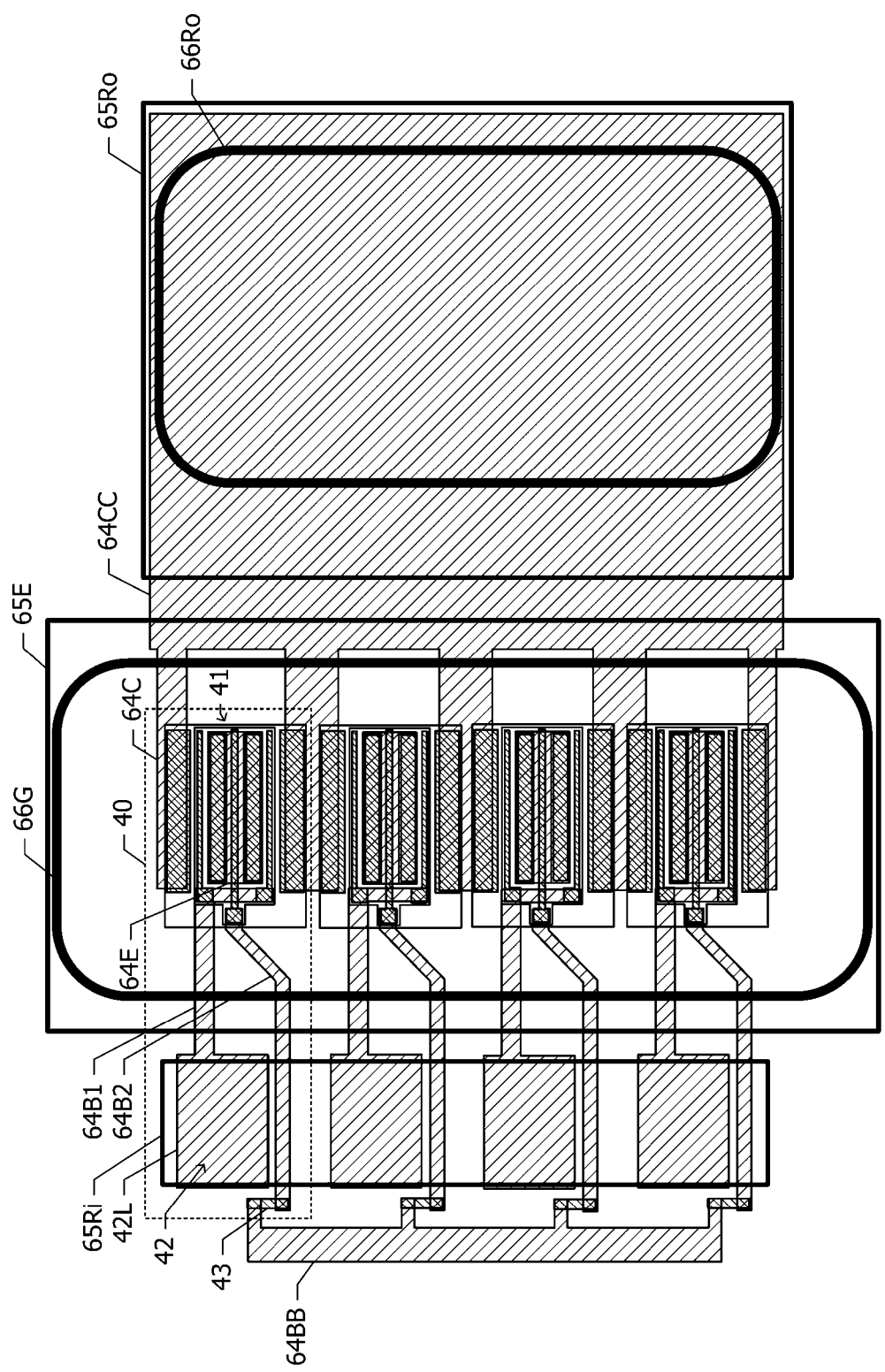
FIG. 4 illustrates planar positional relationship between constituent components of the second amplifier circuit of the radio-frequency power-amplifying element in the first example.

FIG. 4 illustrates planar positional relationship between constituent components of the second amplifier circuit 22 of the radio-frequency power-amplifying element 20 (see FIG. 1) in the first example. Contact holes extending from an upper wiring layer to a lower wiring layer are omitted from FIG. 4. Four unitary cells 40 are arranged side by side in a direction orthogonal to the longitudinal direction of the emitter mesa layers 62. The direction concerned is hereinafter referred to as an arrangement direction of the unitary cells 40. The unitary cells 40 each include the bipolar transistor 41, the capacitive element 42, and the resistive element 43.

The bipolar transistors 41 of the four unitary cells 40 are located within an emitter line 65E when viewed in plan. The emitter line 65E is disposed in a second wiring layer and is connected to emitter lines 64E (see FIGS. 2B and 3) disposed in a first wiring layer below the second wiring layer.

The bipolar transistors 41 are each provided with collector extended lines 64C, a first base extended line 64B1, and a second base extended line 64B2, which extend out from the bipolar transistor 41 in directions crossing the arrangement direction of the unitary cells 40. The first base extended line 64B1 and the second base extended line 64B2 extend out from the bipolar transistor 41 in a direction opposite the direction in which the collector extended lines 64C extend out from the bipolar transistor 41. The adjoining collector extended lines 64C of two adjacent unitary cells 40 are combined into one piece.

The collector extended lines 64C are connected to a collector common line 64CC, which is laterally adjacent to the unitary cells 40. As with the collector extended lines 64C, the collector common line 64CC is disposed in the first wiring layer. When viewed in plan, a radio-frequency signal output line 65Ro overlaps the collector common line 64CC. The radio-frequency signal output line 65Ro is disposed in the second wiring layer and is connected to the collector common line 64CC disposed in the first wiring layer below the second wiring layer.

The first base extended lines 64B1 extend beyond the emitter line 65E in the second wiring layer when viewed in plan. Each of the first base extended lines 64B1 is connected to a lower electrode 42L of the corresponding capacitive element 42. As with the first base extended lines 64B1, the lower electrodes 42L are disposed in the first wiring layer. The second wiring layer includes a radio-frequency signal input line 65Ri, which overlaps the lower electrodes 42L when viewed in plan. The capacitive elements 42 are formed in an overlap between the radio-frequency signal input line 65Ri and the lower electrodes 42L. The radio-frequency signal input line 65Ri is connected to the interstage matching circuit 24 (see FIG. 1).

The second base extended lines 64B2 intersect the radio-frequency signal input line 65Ri and extend beyond the radio-frequency signal input line 65Ri toward the side opposite the bipolar transistors 41. A tip of each of the second base extended lines 64B2 is connected to one end of the corresponding resistive element 43. The other end of each of the resistive elements 43 is connected to a common base bias input line 64BB. As with the second base extended lines 64B2, the base bias input line 64BB is disposed in the first wiring layer. The base bias input line 64BB is connected to the second bias circuit 26 (see FIG. 1).

When viewed in plan, a ground external connection terminal 66G and a radio-frequency signal output terminal 66Ro, respectively, overlap the emitter line 65E and the radio-frequency signal output line 65Ro that are disposed in the second wiring layer. The ground external connection terminal 66G and the radio-frequency signal output terminal 66Ro are, for example, copper (Cu) pillar bumps.

The ground external connection terminal 66G is connected to the emitter line 65E disposed in the second wiring layer. The radio-frequency signal output terminal 66Ro is connected to the radio-frequency signal output line 65Ro disposed in the second wiring layer. The radio-frequency signal output terminal 66Ro is connected to the inductor 52 (see FIG. 1) and the output matching circuit 53 (see FIG. 1) that are mounted on a module substrate of the power-amplifying module 50. The ground external connection terminal 66G is connected to a ground plane on the module substrate of the power-amplifying module 50 (see FIG. 1) with the radio-frequency power-amplifying element 20 being mounted thereon.

Figure 5:
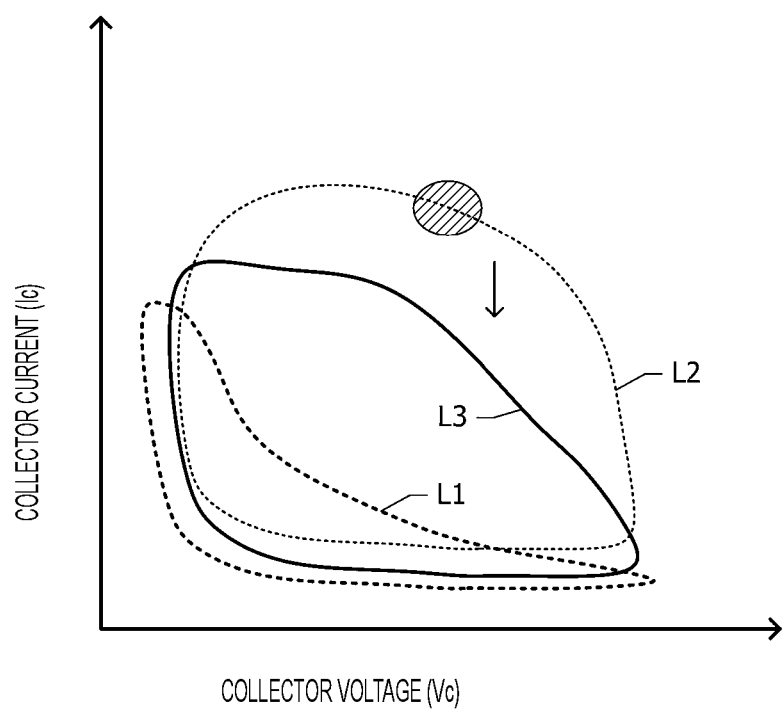
FIG. 5 is a graph showing dynamic load lines of the bipolar transistors included in the second amplifier circuit of the radio-frequency power-amplifying element in the first example.
Figure 6A:
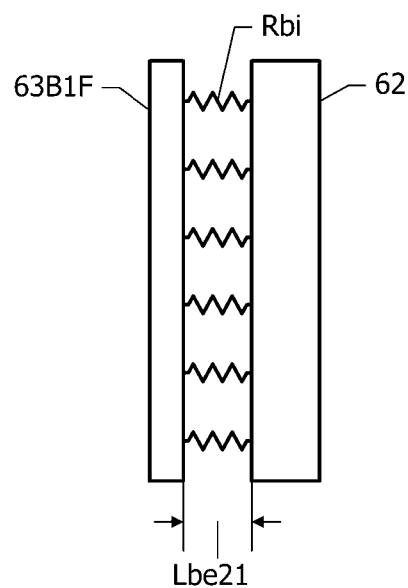
FIG. 6A schematically illustrates planar positional relationship between an emitter mesa layer and a finger portion of a first base electrode of the bipolar transistor of the radio-frequency power-amplifying element in the first example.
Figure 6B:
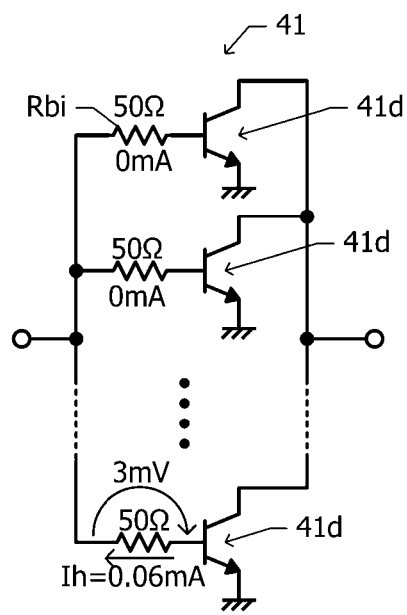
FIG. 6B is an equivalent circuit diagram of a bipolar transistor including micro-transistors.
Figure 6C:
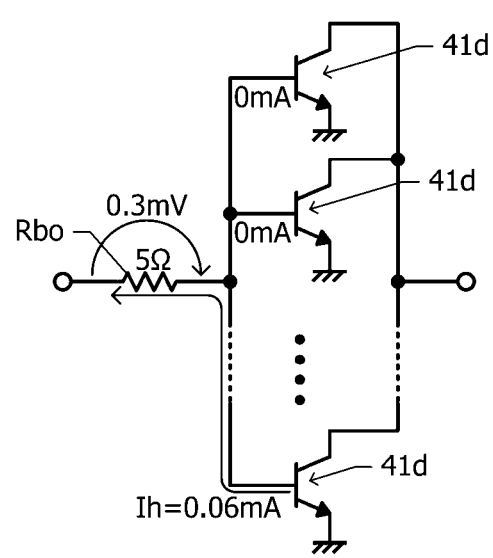
FIG. 6C is an equivalent circuit diagram of a bipolar transistor in which the internal base resistance is substantially zero due to narrowing of the minimum spacing between the emitter mesa layer and the finger portion of the first base electrode.

The following describes advantageous effects of the first example with reference to FIGS. 5 to 6C.

The first example produces the advantageous effect of enabling the radio-frequency power-amplifying element 20 to achieve a higher breakdown withstand voltage so as to be operable for an input signal of increased amplitude and also produces the advantageous effect of offering higher gain.

As a preface for discussing the advantageous effect of increasing the breakdown withstand voltage, the following describes the mechanism by which an element breaks down upon application of a radio-frequency input signal of great amplitude.

When the second amplifier circuit 22 (see FIG. 1) is driven under envelope tracking operation, high power voltage can be applied to the collector of the bipolar transistor 41 of the second amplifier circuit 22 in response to an increase in the amplitude of a radio-frequency input signal. When the collector voltage is increased due to such a radio-frequency input signal of great amplitude, an output signal from the collector involves simultaneous high voltage and high current for a certain period of time. The output signal is likely to involve simultaneous high voltage and high current when an output impedance mismatch is created due to load fluctuations.

According to a known technique for increasing the gain of the second amplifier circuit 22, the spacing between the base electrode supplied with radio-frequency signals and the emitter mesa layer (i.e., the spacing corresponding to Lbe21 in FIG. 2B) is narrowed to reduce the internal base resistance. The low internal base resistance can hardly produce the effect of reducing the amplitude of base current during occurrence of an output impedance mismatch. As a result, the collector current of great amplitude and collector voltage of great amplitude are present for a certain period of time.

Under high collector current and high collector voltage conditions, collision ionization takes place in the region of strong electric field in the collector layer 61C (see FIG. 3) and results in avalanche amplification, in which a large number of electron-hole pairs are generated. The electrons move toward the sub-collector layer 60 (see FIG. 3), thus causing an increase in collector current. The holes flow into the base layer 61B (see FIG. 3), and the base current decreases accordingly. As the base current decreases, the amount of voltage drop at the resistive element 43 (see FIG. 1) connected to the base and the amount of voltage drop at the internal base resistance are reduced. Consequently, the net base voltage applied to the base layer 61B rises. The rise in base voltage leads to an increase in collector current. The term "internal base resistance" herein refers to resistance of a current path including the base layer 61B between the first base electrode 63B1 and the emitter mesa layer 62 and between the second base electrode 63B2 and the emitter mesa layer 62 (see FIG. 3).

When the collector current is increased partly due to electrons and partly due to the rise in base voltage as described above, the collision ionization is initiated anew, and more and more electron-hole pairs are generated accordingly. The positive feedback causes a further increase in collector current. When the increase in the collector current flowing through one of the bipolar transistors 41 connected in parallel is greater than the increase in the collector current flowing through any other bipolar transistor 41, a larger amount of collector current flows through the bipolar transistor 41 concerned. This will eventually lead to breakdown of the element.

The configuration of the radio-frequency power-amplifying element 20 in the first example is conducive to eliminating or reducing the possibility of breakdown of the element. There are two reasons for this.

The first reason is as follows. In the first example, Lbe21 (see FIG. 2B) is greater than Lbe11 (see FIG. 2A), where Lbe21 denotes the minimum spacing between each of the first base electrodes 63B1 and the corresponding emitter mesa layer 62 in the second amplifier circuit 22, and Lbe11 denotes the minimum spacing between each of the first base electrodes 63B1 and the corresponding emitter mesa layer 62 in the first amplifier circuit 21. The bipolar transistor 41 of the second amplifier circuit 22 in the first example has greater internal base resistance to a radio-frequency signal than the bipolar transistor 41 of the second amplifier circuit 22 in a comparative example in which the minimum spacing Lbe21 is equal to the minimum spacing Lbe11. Upon application of a radio-frequency input signal of great amplitude, the bipolar transistor 41 with greater internal base resistance inhibits a significant increase in base current. Without a significant increase in base current, the amplified radio-frequency collector current is not that high, and the possibility of occurrence of collision ionization followed by generation of electron-hole pairs is reduced accordingly. This enables a reduction in the possibility of occurrence of avalanche amplification that follows collision ionization, thus making the element less susceptible to breakdown.

FIG. 5 is a graph showing dynamic load lines of the bipolar transistors 41 included in the second amplifier circuit 22. The horizontal axis represents collector voltage Vc and the vertical axis represent collector current Ic. L1 denotes the dynamic load line under an impedance-matched condition and is approximately L-shaped. This means that a rise in the collector current Ic and a rise in the collector voltage Vc are mutually exclusive.

L2 denotes the dynamic load line during occurrence of an output impedance mismatch and is curved outward so as to be closer than the dynamic load line L1 to the high-voltage side and the high-current side. When the collector current Ic and the collector voltage Vc rise upon application of a radio-frequency input signal of great amplitude and reach a breakdown region (i.e., a hatched region), the element can break down. Meanwhile, the first example inhibits a significant increase in the collector current Ic upon application of a radio-frequency input signal of great amplitude. As denoted by L3, the dynamic load line of the bipolar transistor 41 in the first example is closer than the dynamic load line L2 to the low-current side. This means that the collector current Ic and the collector voltage Vc are kept from reaching the breakdown region (i.e., the hatched region). The element is thus less susceptible to breakdown.

The second reason is as follows. As more and more electron-hole pairs are generated due to collision ionization, the collector current flowing through the bipolar transistor 41 increases correspondingly. The common current-voltage characteristics are exhibited in a low-current region in which collision ionization does not occur; that is, the collector voltage rises as the collector current increases up to a certain point, after which the collector voltage change is shifted in a negative direction. The range of the shift is known as a negative resistance region. Owing to the internal base resistance, the first example enables the element to achieve an increase in the absolute value of negative resistance and an increase in the collector voltage at which the negative resistance region appears. During occurrence of an output impedance mismatch, the element is thus kept from reaching the negative resistance region until after the collector voltage rises to a high level. This eliminates or reduces the possibility that electric current will concentrate in a specific bipolar transistor 41 before the collector voltage reaches such a high level. The element is thus less susceptible to breakdown.

Although the mechanism by which the element breaks down due to concentration of collector current in one of the bipolar transistors 41 has been described so far, the collector current can concentrate in a particular site within one bipolar transistor 41. The flow of collector current may not be constant in the longitudinal direction of the emitter mesa layers 62 (see FIG. 2B); that is, the collector current density can be higher in a particular site than any other site. The element is likely to suffer a breakdown at the site of high current density.

As will be described below, the first example also eliminates or reduces the possibility that the element will suffer such a breakdown resulting from concentration of electric current in a particular site within one bipolar transistor 41.

FIG. 6A schematically illustrates planar positional relationship between the emitter mesa layer 62 and the finger portion 63B1F of the first base electrode 63B1 of the bipolar transistor 41 of the radio-frequency power-amplifying element 20 in the first example. The emitter mesa layer 62 and the finger portion 63B1F of the first base electrode 63B1 are arranged with a gap therebetween in a direction orthogonal to the longitudinal direction of the emitter mesa layer 62 (i.e., in the width direction of the emitter mesa layer 62). The region between the emitter mesa layer 62 and the first base electrode 63B1 has internal base resistance comprised of internal base resistors Rbi and provided in accordance with the minimum spacing Lbe21 between the emitter mesa layer 62 and the finger portion of the first base electrode 63B1. The internal base resistors Rbi are distributed substantially uniformly in the longitudinal direction of the emitter mesa layer 62.

Each of the bipolar transistors 41 may be regarded as micro-transistors 41d that are connected in parallel and arranged in the longitudinal direction of the emitter mesa layers 62.

FIG. 6B is an equivalent circuit diagram of the bipolar transistor 41 including the micro-transistors 41d. The internal base resistors Rbi are regarded as being connected to the bases of the respective micro-transistors 41d. The base of each of the micro-transistors 41d is supplied with radio-frequency signals through the corresponding internal base resistor Rbi.

The following describes the consequences of generation of electron-hole pairs by collision ionization in an end portion of the emitter mesa layer 62. Holes generated by collision ionization pass through the internal base resistors Rbi and flows into the first base electrodes 63B1. Consequently, base current Ih (see FIG. 6B) comprised of holes flows through the last micro-transistor 41d on the side corresponding to the end portion of the emitter mesa layer 62. As the base current Ih comprised of holes flows through the internal base resistors Rbi, the base voltage rises.

The negative resistance region then appears, where an increase in collector current is suppressed as the base current rises. As a result, the electric current becomes less concentrated in the last micro-transistor 41d (see FIG. 6B) on the side corresponding to the location of occurrence of collision ionization followed by generation of electron-hole pairs.

FIG. 6C is an equivalent circuit diagram of the bipolar transistor 41 in which the internal base resistance comprised of the internal base resistors Rbi is substantially zero due to narrowing of the minimum spacing Lbe21 between the emitter mesa layer 62 and the finger portion 63B1F of the first base electrode 63B1. In place of the internal base resistors Rbi, an external base resistor Rbo is connected externally to the bipolar transistor 41 illustrated in FIG. 6C. The external base resistor Rbo is shared by all of the micro-transistors 41d.

Suppose Rbip, which denotes a resistor comprised of the internal base resistors Rbi connected in parallel, has a resistance value of 5Ω. The resistance value of the external base resistor Rbo (see FIG. 6C) is matched to the resistance value of the internal base resistor Rbip; that is, the resistance value of the external base resistor Rbo is set to 5Ω. When the bipolar transistor 41 in FIG. 6B includes ten micro-transistors 41d, the internal base resistors Rbi of the respective micro-transistors 41d each have a resistance value of 50Ω.

Suppose 0.06 mA of base current Ih comprised of holes flows through one of the micro-transistors 41d. Referring to FIG. 6B illustrating the configuration in the first example, the base current Ih comprised of holes flows through each internal base resistor Rbi having a resistance value of 50Ω and causes a 3 mV rise in base voltage. Referring to FIG. 6C, the base current Ih flows through the external base resistor Rbo having a resistance value of 5Ω and causes a 0.3 mV rise in base voltage.

As for the micro-transistor 41d at the site of occurrence of collision ionization, the configuration in FIG. 6B yields a 3 mV rise in base voltage whereas the configuration in FIG. 6C yields only a 0.3 mV rise in base voltage. The first example (see FIG. 6B) is more effective in suppressing the increase in the collector current in the negative resistance region than the comparative example (see FIG. 6C) involving the addition of the external base resistor Rbo.

The first example also offers advantages arising from the resistive elements 43 connected to the bases of the respective the bipolar transistors 41 included in the second amplifier circuit 22 (see FIG. 1). The resistive elements 43 eliminate or reduce the possibility that the bipolar transistors 41 will exhibit thermal runaway. As an alternative approach to eliminating or reducing the occurrence of thermal runaway, the minimum spacing Lbe22 (see FIG. 2B) between the emitter mesa layers 62 and the finger portion 63B2F of the second base electrode 63B2 may be widened to increase the internal base resistance without the use of the resistive element 43.

The minimum spacing Lbe22 in the bipolar transistor with increased base resistance that is as effective as the resistive element 43 is about ten times the minimum spacing Lbe22 in the bipolar transistor with the external connection of the resistive element 43. Widening the minimum spacing Lbe22 involves an increase in the area of the mating surface between the base layer 61B (see FIG. 3) and the collector layer 61C (see FIG. 3), thus leading to unduly large base-collector junction capacitance. As a result, the radio-frequency characteristics of the bipolar transistor 41 will degrade. The first example, or more specifically, the bipolar transistor 41 with the external connection of the resistive element 43 is conducive to eliminating or reducing the occurrence of thermal runaway and minimizing degradation in radio-frequency characteristics.

The minimum spacing Lbe22 in the bipolar transistor 41 of the second amplifier circuit 22 is preferably narrowed to the extent that the resistance value (i.e., the value of internal base resistance) of the current path including the base layer 61B between the second base electrode 63B2 and the emitter mesa layer 62 is not more than about one-tenth of the resistance value of the resistive element 43 connected externally to the bipolar transistor 41.

As with the second amplifier circuit 22, the first amplifier circuit 21 includes the resistive elements 33 connected externally to the respective bipolar transistors 31. This configuration enables narrowing of the minimum spacing Lbe12 (see FIG. 2A) between the emitter mesa layer 62 and the finger portion 63B2F of the second base electrode 63B2. The first amplifier circuit 21 can thus benefit from the effect of eliminating or reducing the occurrence of thermal runaway and minimizing degradation in radio-frequency characteristics. The minimum spacing Lbe12 is preferably narrowed to the extent that the value of the internal base resistance arising from the base layer 61B between the second base electrode 63B2 and the emitter mesa layer 62 is not more than about one-tenth of the resistance value of the resistive element 33.

In the first example, the minimum spacing Lbe11 between the finger portion 63B1F of each of the first base electrodes 63B1 and the corresponding emitter mesa layer 62 of the bipolar transistor 31 included in the first amplifier circuit 21 is smaller than the minimum spacing Lbe21 in the second amplifier circuit 22. The minimum spacing Lbe11 may be narrowed to the extent possible with the available process technology. As the minimum spacing Lbe11 is narrowed, the internal base resistance inserted into the radio-frequency signal line of the first amplifier circuit 21 is reduced correspondingly. The reduction in the internal base resistance inserted into the radio-frequency signal line translates into an increase in the gain of the first amplifier circuit 21.

As mentioned above, the minimum spacing Lbe11 in each of the bipolar transistors 31 of the first amplifier circuit 21 is smaller than the minimum spacing Lbe21. This enables the first amplifier circuit 21 in the first example to achieve higher gain. To put it the other way around, the minimum spacing Lbe21 in each of the bipolar transistor 41 of the second amplifier circuit 22 is greater than the minimum spacing Lbe11. This enables the second amplifier circuit 22 in the first example to achieve a high withstand voltage.

According to a known approach to enabling a radio-frequency power-amplifying element to achieve higher gain and a higher withstand voltage, the multilayer structure of the bipolar transistors 31 of the first amplifier circuit 21 is different from the multilayer structure of the bipolar transistors 41 of the second amplifier circuit 22. Such a radio-frequency power-amplifying element requires that two different multilayer structures-one for the bipolar transistors 31 of the first amplifier circuit 21 and the other for the bipolar transistors 41 of the second amplifier circuit 22—be formed individually on the common substrate. In the first example, meanwhile, the multilayer structure of the bipolar transistors 31 of the first amplifier circuit 21 is identical to the multilayer structure of the bipolar transistors 41 of the second amplifier circuit 22. This configuration adds no further complications and inconveniences to the production processes and enables cost containment.

The following describes a modification of the first example.

In the first example, the minimum spacing Lbe21 in each of the bipolar transistors 41 of the second amplifier circuit 22 is greater than the minimum spacing Lbe11 in each of the bipolar transistors 31 of the first amplifier circuit 21. Meanwhile, specific ones of the bipolar transistors 41 are more prone to breakdown than the other bipolar transistors 41 when an output impedance mismatch is created. For example, one of the bipolar transistors 41 that has specific positional relationship with other circuit elements is more susceptible to breakdown than the other bipolar transistors 41. The configuration in the first example may thus be adopted into only the bipolar transistor 41 that is more susceptible to breakdown.

Although the first amplifier circuit 21 in the first example includes two unitary cells 30 and the second amplifier circuit 22 in the first example includes four unitary cells 40, the number of unitary cells 30 and the number of unitary cells 40 are not limited to these values. For example, the first amplifier circuit 21 may include one unitary cell 30 or at least three unitary cells 30, and the second amplifier circuit 22 may include at least five unitary cells 40.

Although the bipolar transistors 31 and 41 in the first example are GaAs/InGaP-based HBTs, the bipolar transistors 31 and 41 may be HBTs made from other compound semiconductors. Alternatively, the bipolar transistors 31 and 41 may be homojunction bipolar transistors.

Although the output matching circuit 53 (see FIG. 1) in the first example is mounted on the module substrate of the power-amplifying module 50, the output matching circuit 53 and the radio-frequency power-amplifying element 20 may be mounted on the same substrate, namely, the substrate 80 (see FIG. 3). Alternatively, any one or two of the input matching circuit 23 (see FIG. 1), the first bias circuit 25 (see FIG. 1), the second bias circuit 26 (see FIG. 1) may be mounted on the module substrate.

The ground external connection terminal 66G (see FIG. 4) and the radio-frequency signal output terminal 66Ro (see FIG. 4) in the first example are Cu pillar bumps. The radio-frequency power-amplifying element 20 (see FIG. 1) is thus mounted face-down on the module substrate by flip-chip mounting. Alternatively, the ground external connection terminal 66G (see FIG. 4) may be a metal layer on a back surface of the substrate 80 (see FIG. 3), and the radio-frequency signal output terminal 66Ro (see FIG. 4) may be a pad for wire bonding. In this case, the metal layer on the back surface is connected to the emitter line 65E through a via hole extending through the substrate 80 in the thickness direction, and the radio-frequency power-amplifying element 20 is mounted face-up on the module substrate.

Second Example

Figure 7:
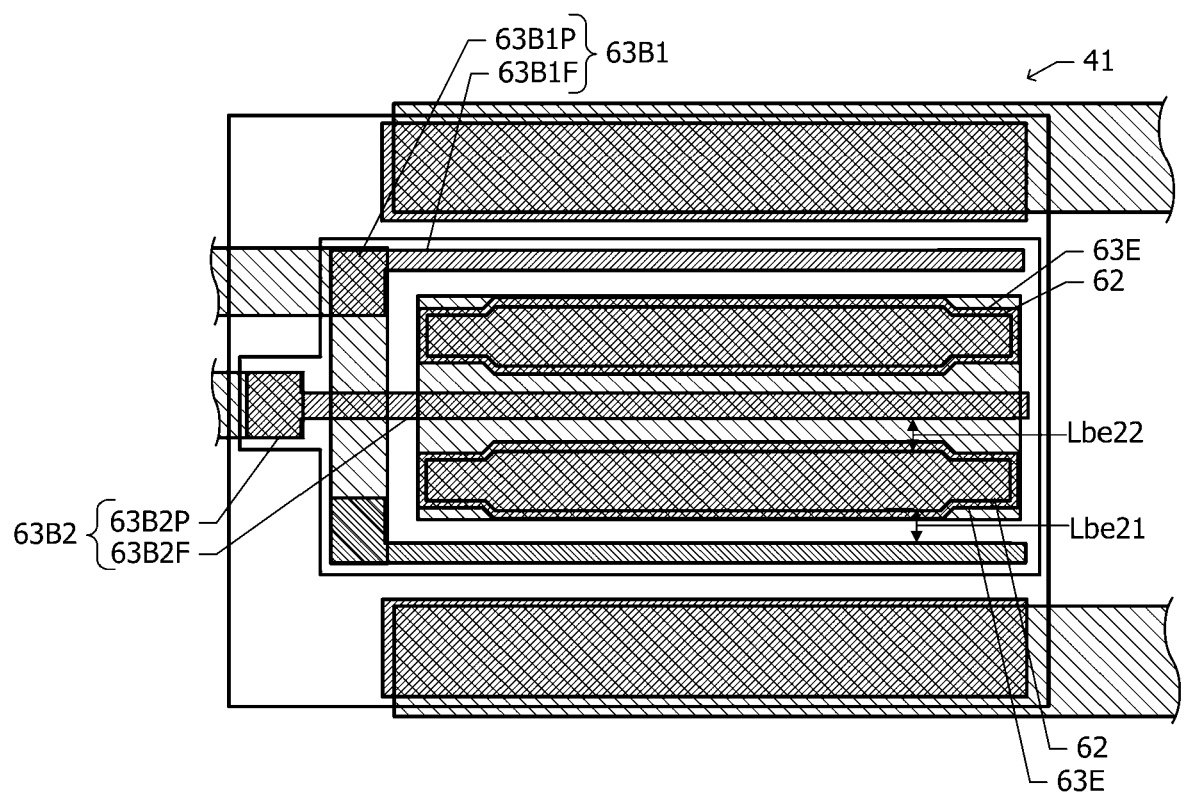
FIG. 7 illustrates planar positional relationship between constituent components of a bipolar transistor included in a second amplifier circuit of a radio-frequency power-amplifying element in a second example.

The following describes a radio-frequency power-amplifying element in a second example with reference to FIG. 7. Configurations common to the radio-frequency power-amplifying element 20 in the first example (see FIGS. 1 to 4) will not be further elaborated here.

FIG. 7 illustrates planar positional relationship between constituent components of the bipolar transistor 41 included in the second amplifier circuit 22 (see FIG. 1) of the radio-frequency power-amplifying element 20 in the second example. The emitter mesa layers 62 and the emitter electrodes 63E in the first example are substantially rectangular when viewed in plan. The second example differs from the first example in that the emitter mesa layers 62 and the emitter electrodes 63E each have a shape whose end portions are narrower than the rectangular portion between the end portions when viewed in plan.

The spacing between the finger portion 63B1F of each of the first base electrodes 63B1 and the corresponding emitter mesa layer 62 is therefore not constant. Lbe21 denotes the minimum spacing between the finger portion 63B1F of each of the first base electrodes 63B1 and a region that is part of the corresponding emitter mesa layer 62 and that is located between the end portions of the emitter mesa layer 62 viewed in plan.

The following describes advantageous effects of the second example.

In the second example, the internal base resistance per unit length in the end portions of each of the emitter mesa layers 62 is higher than the internal base resistance per unit length in the region being part of the emitter mesa layers 62 and located between the end portions thereof. Thus, the collector current mostly flows through the region being part of the emitter mesa layers 62 and located between the end portions thereof. If the main flow of the collector current shifts to the end portions of the emitter mesa layers 62 for any reason, the operation of the bipolar transistor 41 would become unstable. In the second example, meanwhile, the main flow of the collector current is less likely to shift to the end portions of the emitter mesa layers 62, and the operation of the bipolar transistor 41 is thus less likely to become unstable.

As in the first example, Lbe21 is greater than Lbe11 in the second example, where Lbe21 denotes the minimum spacing between the finger portion 63B1F of each of the first base electrodes 63B1 and the corresponding emitter mesa layer 62 of the bipolar transistor 41 of the second amplifier circuit 22 (see FIG. 1) viewed in plan, and Lbe11 denotes the minimum spacing between the finger portion 63B1F of each of the first base electrodes 63B1 and the corresponding emitter mesa layer 62 of the bipolar transistor 31 of the first amplifier circuit 21 (see FIG. 1) viewed in plan. In common with the radio-frequency power-amplifying element 20 in first example, the radio-frequency power-amplifying element 20 in the second example achieves a high withstand voltage and high gain accordingly.

In either of the first and second examples, the multilayer structure of the bipolar transistors 31 included in the first amplifier circuit 21 is identical to the multilayer structure of the bipolar transistors 41 included in the second amplifier circuit 22. This configuration adds no further complications and inconveniences to the production processes and enables cost containment.

Third Example

Figure 8A:
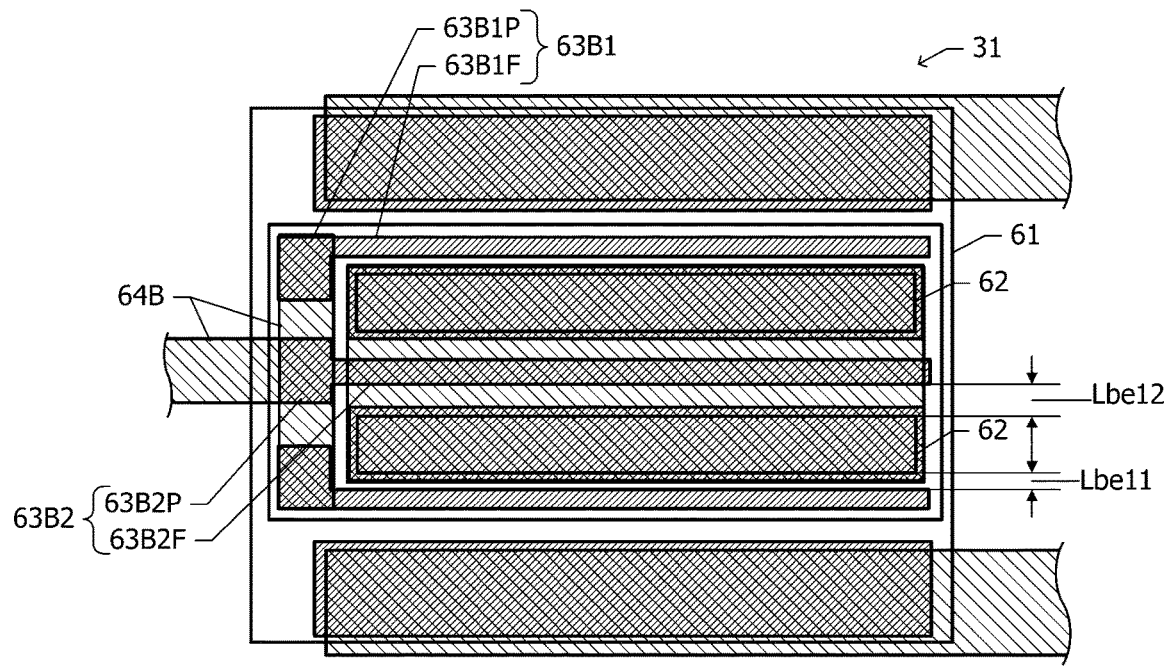
FIG. 8A illustrates a planar layout of constituent components of one of bipolar transistors included in a first amplifier circuit of a radio-frequency power-amplifying element in a third example.
Figure 8B:
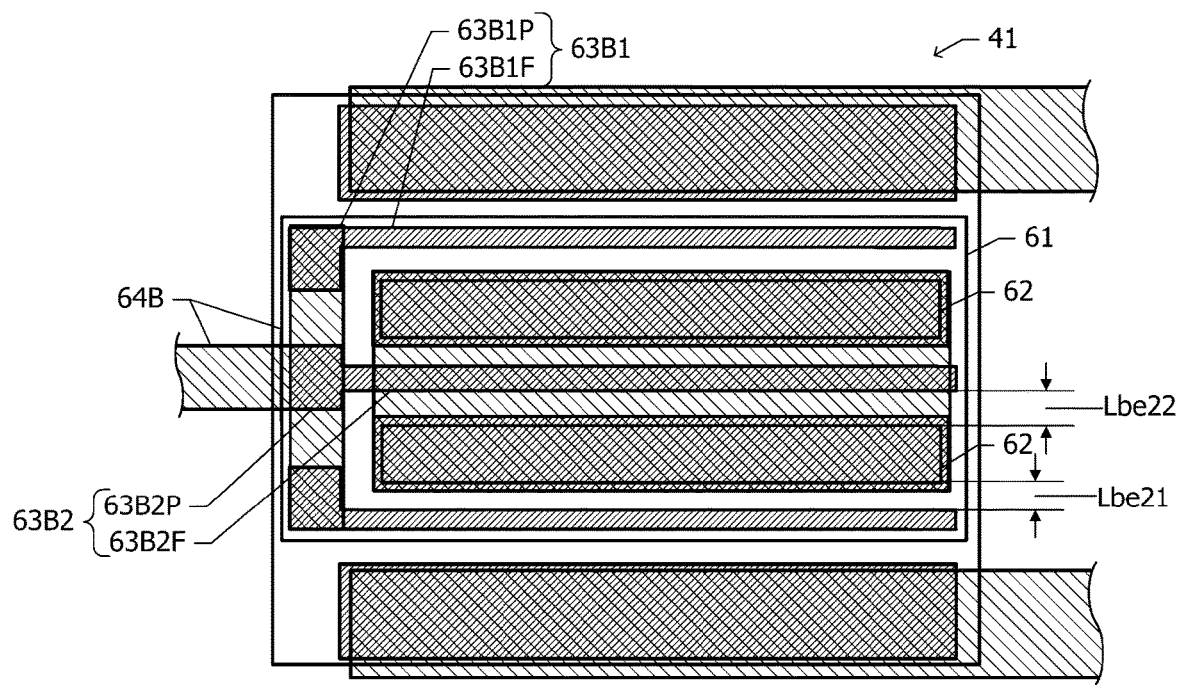
FIG. 8B illustrates a planar layout of constituent components of one of bipolar transistors included in a second amplifier circuit of the radio-frequency power-amplifying element in the third example.

The following describes a radio-frequency power-amplifying element in a third example with reference to FIGS. 8A and 8B. Configurations common to the radio-frequency power-amplifying element 20 in the first example (see FIGS. 1 to 4) will not be further elaborated here.

FIG. 8A illustrates a planar layout of constituent components of one of the bipolar transistors 31 included in the first amplifier circuit 21 (see FIG. 1) of the radio-frequency power-amplifying element 20 in the third example. FIG. 8B illustrates a planar layout of constituent components of one of the bipolar transistors 41 included in the second amplifier circuit 22 (see FIG. 1) of the radio-frequency power-amplifying element 20 in the third example.

In the first example (see FIGS. 2A and 2B), the first base electrodes 63B1 are connected to the first base extended line 64B1, and the second base electrode 63B2 is connected to the second base extended line 64B2. The third example differs from the first example in that the pad portions 63B1P of the first base electrodes 63B1 and the pad portion 63B2P of the second base electrode 63B2 are connected to a common base extended line 64B.

The pad portions 63B1P of two first base electrodes 63B1 and the pad portion 63B2P of one second base electrode 63B2 are in the positional agreement in the longitudinal direction of the emitter mesa layers 62. The third example thus eliminates the protruding portion 61A of the collector mesa layer 61 included in each of the bipolar transistors 31 and 41 (see FIGS. 2A and 2B) of the radio-frequency power-amplifying element 20 in the first example.

The common base extended line 64B includes a portion extending in a direction orthogonal to the longitudinal direction of the emitter mesa layers 62. The common base extended line 64B and the pad portion 63B2P of the second base electrode 63B2 are connected to each other at a junction, from which the common base extended line 64B extends in the longitudinal direction of the emitter mesa layers 62 beyond and away from the collector mesa layer 61 when viewed in plan.

As in the first example, Lbe21 is greater than Lbe11, where Lbe21 denotes the minimum spacing between the finger portion 63B1F of each of the first base electrodes 63B1 and the corresponding emitter mesa layer 62 of the bipolar transistor 41 (see FIG. 8B) of the second amplifier circuit 22, and Lbe11 denotes the minimum spacing between the finger portion 63B1F of each of the first base electrodes 63B1 and the corresponding emitter mesa layer 62 of the bipolar transistor 31 (see FIG. 8A) of the first amplifier circuit 21. Lbe22 and Lbe21 in the bipolar transistor 41 of the second amplifier circuit 22 are substantially equal to each other, where Lbe22 denotes the minimum spacing between the finger portion 63B2F of the second base electrode 63B2 and each of the emitter mesa layers 62, and Lbe21 denotes the minimum spacing between the finger portion 63B2F of each of the first base electrodes 63B1 and the corresponding emitter mesa layer 62. This is because not only the first base electrodes 63B1 but also the second base electrode 63B2 is supplied with radio-frequency signals.

The following describes advantageous effects of the third example.

In the third example, the minimum spacing Lbe21 (see FIG. 8B) in the bipolar transistor 41 of the second amplifier circuit 22 is greater than the minimum spacing Lbe11 (see FIG. 8A) in the bipolar transistor 31 of the first amplifier circuit 21. In common with the radio-frequency power-amplifying element 20 in first example, the radio-frequency power-amplifying element 20 in the third example achieves a high withstand voltage and high gain accordingly.

In either of the first and third examples, the multilayer structure of the bipolar transistors 31 included in the first amplifier circuit 21 is identical to the multilayer structure of the bipolar transistors 41 included in the second amplifier circuit 22. This configuration adds no further complications and inconveniences to the production processes and enables cost containment.

The third example eliminates the need for the protruding portions 61A (see FIGS. 2A and 2B) of the collector mesa layer 61 in the first example, thus enabling a reduction in base-collector junction capacitance. The overall gain of the radio-frequency power-amplifying element 20 may be improved accordingly.

Fourth Example

Figure 9A:
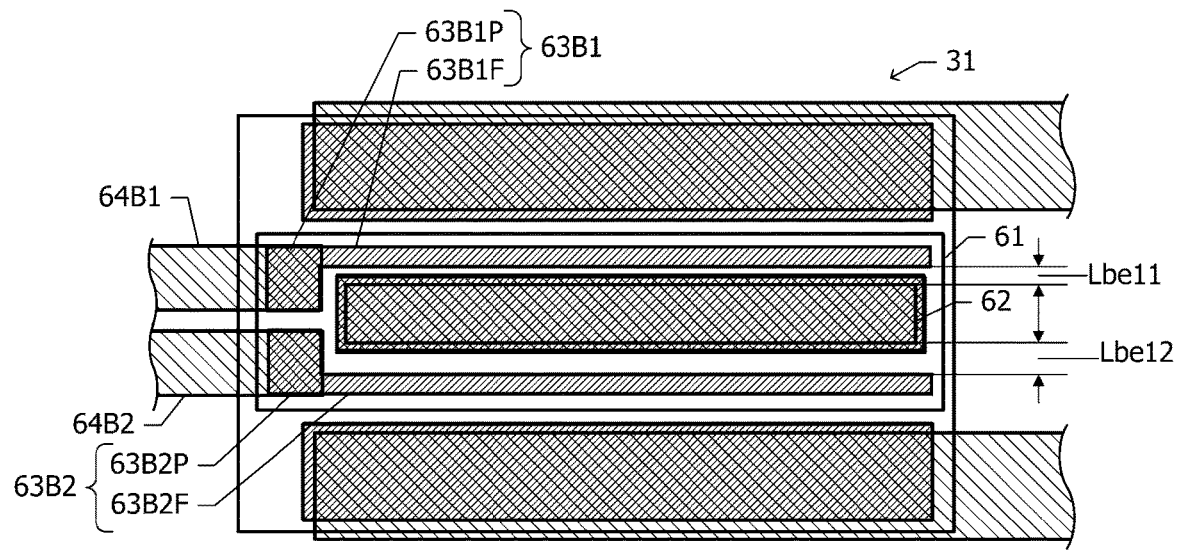
FIG. 9A illustrates a planar layout of constituent components of one of bipolar transistors included in a first amplifier circuit of a radio-frequency power-amplifying element in a fourth example.
Figure 9B:
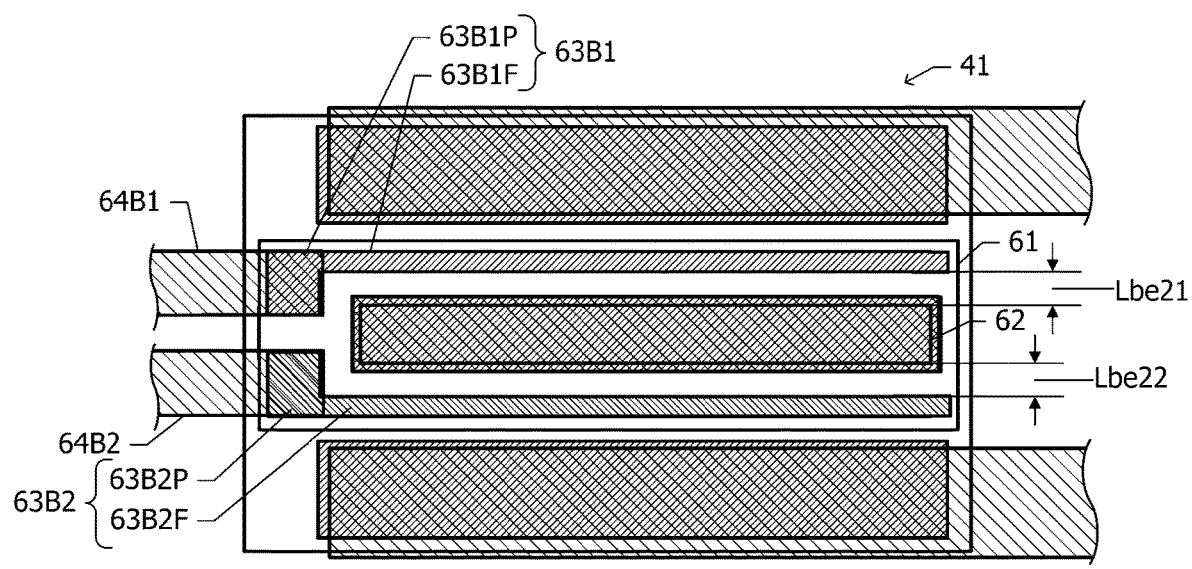
FIG. 9B illustrates a planar layout of constituent components of one of bipolar transistors included in a second amplifier circuit of the radio-frequency power-amplifying element in the fourth example.

The following describes a radio-frequency power-amplifying element in a fourth example with reference to FIGS. 9A and 9B. Configurations common to the radio-frequency power-amplifying element 20 in the first example (see FIGS. 1 to 4) will not be further elaborated here.

FIG. 9A illustrates a planar layout of constituent components of one of the bipolar transistors 31 included in the first amplifier circuit 21 (see FIG. 1) of the radio-frequency power-amplifying element 20 in the fourth example. FIG. 9B illustrates a planar layout of constituent components of one of the bipolar transistors 41 included in the second amplifier circuit 22 (see FIG. 1) of the radio-frequency power-amplifying element 20 in the fourth example.

The bipolar transistors 31 and 41 in the first example each include two emitter mesa layers 62 (see FIGS. 2A and 2B). The fourth example differs from the first example in that the bipolar transistors 31 and 41 each include one emitter mesa layer 62. The finger portion 63B1F of the first base electrode 63B1 and the finger portion 63B2F of the second base electrode 63B2 are disposed so as to be on opposite sides of the emitter mesa layer 62 in the width direction of the emitter mesa layer 62.

As in the first example, Lbe21 is greater than Lbe11 in the fourth example, where Lbe21 denotes the minimum spacing between the finger portion 63B1F of the first base electrode 63B1 and the emitter mesa layer 62 of the bipolar transistor 41 of the second amplifier circuit 22, and Lbe11 denotes the minimum spacing between the finger portion 63B1F of the first base electrode 63B1 and the emitter mesa layer 62 of the bipolar transistor 31 of the first amplifier circuit 21.

The following describes advantageous effects of the fourth example.

In the fourth example, the minimum spacing Lbe21 in the bipolar transistor 41 of the second amplifier circuit 22 is greater than the minimum spacing Lbe11 in the bipolar transistor 31 of the first amplifier circuit 21. In common with the radio-frequency power-amplifying element 20 in first example, the radio-frequency power-amplifying element 20 in the fourth example achieves a high withstand voltage and high gain accordingly.

In either of the first and fourth examples, the multilayer structure of the bipolar transistors 31 included in the first amplifier circuit 21 is identical to the multilayer structure of the bipolar transistors 41 included in the second amplifier circuit 22. This configuration adds no further complications and inconveniences to the production processes and enables cost containment.

Fifth Example

Figure 10:
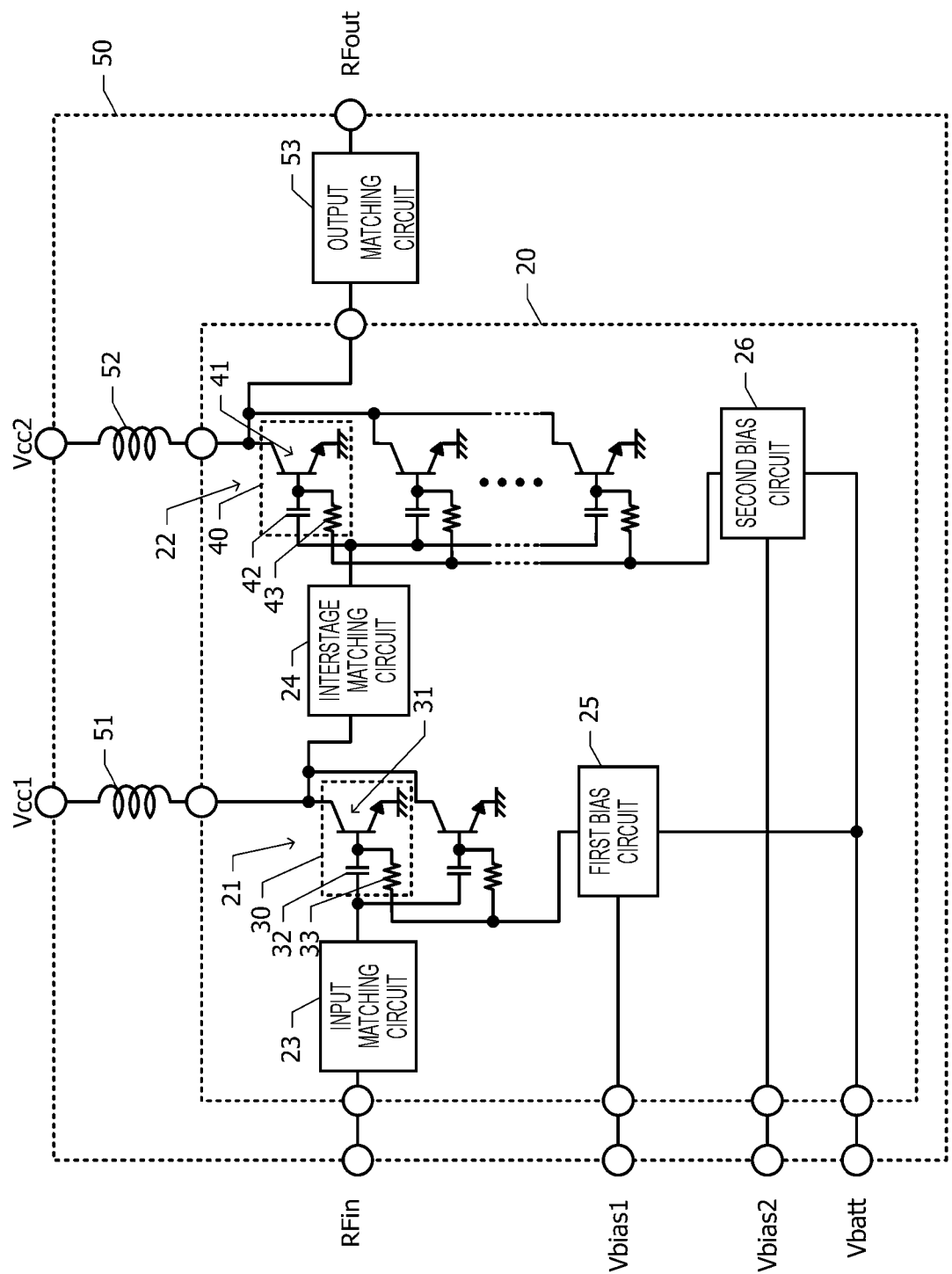
FIG. 10 is an equivalent circuit diagram of a power-amplifying module including a radio-frequency power-amplifying element in a fifth example.
Figure 11A:
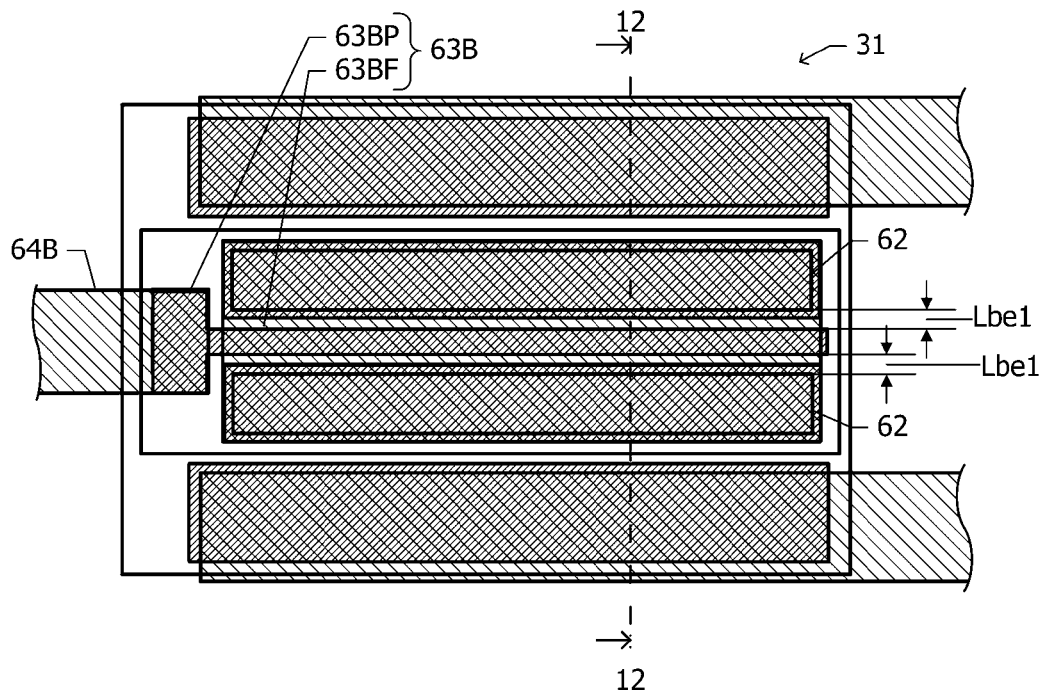
FIG. 11A illustrates a planar layout of constituent components of one of bipolar transistors included in a first amplifier circuit of the radio-frequency power-amplifying element in the fifth example.
Figure 11B:
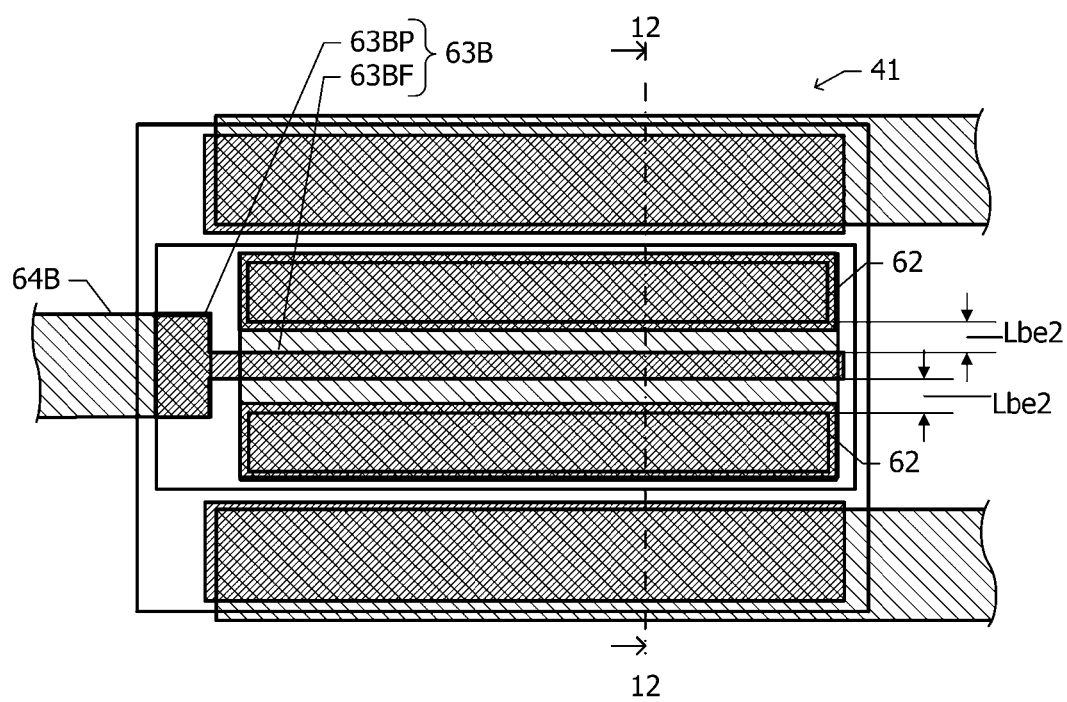
FIG. 11B illustrates a planar layout of constituent components of one of bipolar transistors included in a second amplifier circuit of the radio-frequency power-amplifying element in the fifth example.
Figure 12:
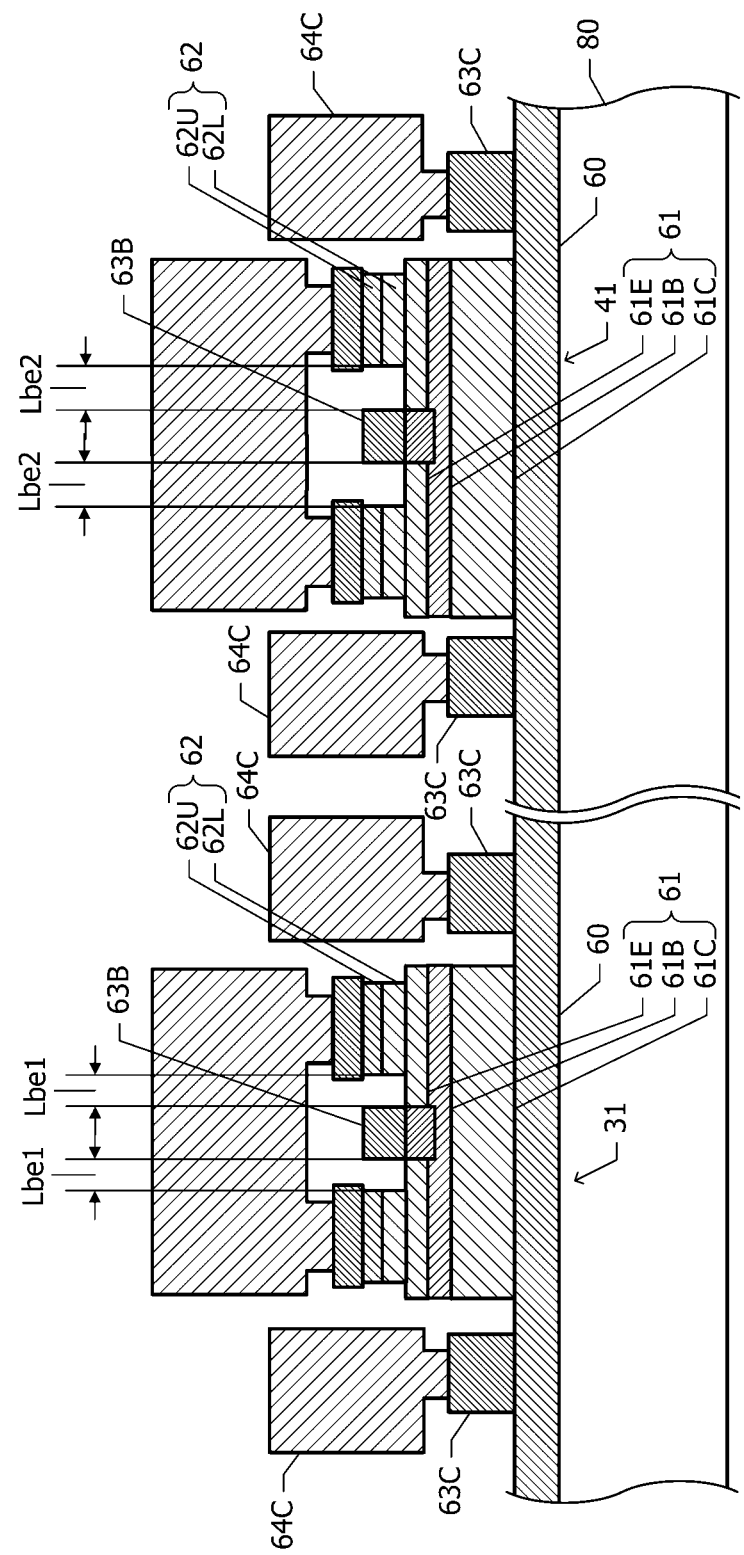
FIG. 12 is a sectional view taken along dash-dot line 12-12 in FIGS. 11A and 11B.

The following describes a radio-frequency power-amplifying element in a fifth example with reference to FIGS. 10 to 12. Configurations common to the radio-frequency power-amplifying element 20 in the first example (see FIGS. 1 to 4) will not be further elaborated here.

FIG. 10 is an equivalent circuit diagram of the power-amplifying module 50 including the radio-frequency power-amplifying element 20 in the fifth example. The difference between the radio-frequency power-amplifying element 20 in the first example (FIG. 1) and the radio-frequency power-amplifying element 20 in the fifth example is in the configuration of the unitary cells 30 of the first amplifier circuit 21 and the unitary cells 40 of the second amplifier circuit 22.

Specifically, the radio-frequency power-amplifying element 20 in the first example (see FIG. 1) includes: the first amplifier circuit 21 in which the capacitive element 32 and the resistive element 33 are connected individually to the bipolar transistor 31; and the second amplifier circuit 22 in which the capacitive element 42 and the resistive element 43 are connected individually to the bipolar transistor 41. The radio-frequency power-amplifying element 20 in the fifth example includes: the first amplifier circuit 21 in which the capacitive element 32 and the resistive element 33 are connected to each other at a connection point that is located outside the bipolar transistor 31 and is connected to the base of the bipolar transistor 31; and the second amplifier circuit 22 in which the capacitive element 42 and the resistive element 43 are connected to each other at a connection point that is located outside the bipolar transistor 41 and is connected to the base of the bipolar transistor 41.

FIG. 11A illustrates a planar layout of constituent components of one of the bipolar transistors 31 included in the first amplifier circuit 21 (see FIG. 10) of the radio-frequency power-amplifying element 20 in the fifth example. FIG. 11B illustrates a planar layout of constituent components of one of the bipolar transistors 41 included in the second amplifier circuit 22 (see FIG. 10) of the radio-frequency power-amplifying element 20 in the fifth example. FIG. 12 is a sectional view taken along dash-dot line 12-12 in FIGS. 11A and 11B.

The bipolar transistors 31 and 41 in the first example (see FIGS. 2A and 2B) each include the first base electrodes 63B1 and the second base electrode 63B2 such that radio-frequency signals are applied to the first base electrodes 63B1 and DC base bias is applied to the second base electrode 63B2. The bipolar transistors 31 and 41 in the fifth example each include a common base electrode 63B. The common base electrode 63B includes a finger portion 63BF and a pad portion 63BP, which is joined to one end of the finger portion 63BF. The finger portion 63BF is interposed between two emitter mesa layers 62.

The pad portions 63BP of the base electrodes 63B are connected with the respective common base extended lines 64B. The base extended line 64B extending out from the bipolar transistor 31 is connected to the capacitive element 32 (see FIG. 10) and the resistive element 33 (see FIG. 10). The base extended line 64B extending out from the bipolar transistor 41 is connected to the capacitive element 42 (see FIG. 10) and the resistive element 43 (see FIG. 10). Each of the base electrodes 63B is supplied with radio-frequency signals through the corresponding one of the capacitive elements 32 and 42 and is also supplied with DC bias current through the corresponding one of the resistive elements 33 and 43.

Lbe2 is greater than Lbe1, where Lbe2 denotes the minimum spacing between the finger portion 63BF of the base electrode 63B and each of the emitter mesa layers 62 of the bipolar transistor 41 of the second amplifier circuit 22, and Lbe1 denotes the minimum spacing between the finger portion 63BF of the base electrode 63B and each of the emitter mesa layers 62 of the bipolar transistor 31 of the first amplifier circuit 21. The minimum spacing between the finger portion 63BF of the common base electrode 63B and one of the emitter mesa layers 62 is equal to the minimum spacing between the finger portion 63BF of the common base electrode 63B and the other emitter mesa layer 62.

As in the first example, the minimum spacing Lbe1 in the bipolar transistor 31 of the first amplifier circuit 21 is preferably narrowed to the extent that the value of internal base resistance arising from the base layer 61B between the base electrode 63B and the emitter mesa layer 62 is not more than about one-tenth of the resistance value of the resistive element 33 connected externally to the bipolar transistor 31. Similarly, the minimum spacing Lbe2 in the bipolar transistor 41 of the second amplifier circuit 22 is preferably narrowed to the extent that the resistance value (i.e., the value of internal base resistance) of the current path including the base layer 61B between the base electrode 63B and the emitter mesa layer 62 is not more than about one-tenth of the resistance value of the resistive element 43 connected externally to the bipolar transistor 41.

The following describes advantageous effects of the fifth example.

Each of the common base electrodes 63B is supplied with radio-frequency signals; that is, the common base electrodes 63B function in a manner similar to the first base electrodes 63B1 (see FIG. 2A and FIG. 2B) included in the radio-frequency power-amplifying element 20 in the first example. In the fifth example, the minimum spacing Lbe2 (see FIG. 11B) in the bipolar transistor 41 of the second amplifier circuit 22 is greater than the minimum spacing Lbe1 (see FIG. 11A) in the bipolar transistor 31 of the first amplifier circuit 21. The minimum spacing Lbe1 and the minimum spacing Lbe2 in the fifth example respectively correspond to the minimum spacing Lbe11 and the minimum spacing Lbe21 in the first example. In common with the radio-frequency power-amplifying element 20 in first example, the radio-frequency power-amplifying element 20 in the fifth example achieves a high withstand voltage and high gain accordingly.

The first base electrodes 63B1 and the second base electrode 63B2 in the first example (see FIG. 2A and FIG. 2B) are replaced with the common base electrode 63B (see FIGS. 11A and 11B) in the fifth example. This alteration enables a reduction in the area of the base-emitter interface without any change in the area of the emitter mesa layers 62. The reduction in the area of the base-emitter interface translates into a reduction in base-collector junction capacitance, and the radio-frequency characteristics may be improved accordingly.

In either of the first and fifth examples, the multilayer structure of the bipolar transistors 31 included in the first amplifier circuit 21 is identical to the multilayer structure of the bipolar transistors 41 included in the second amplifier circuit 22. This configuration adds no further complications and inconveniences to the production processes and enables cost containment.

The following describes modifications of the fifth example.

In the fifth example, the bipolar transistors 31 of the first amplifier circuit 21 and the bipolar transistors 41 of the second amplifier circuit 22 each include the common base electrode 63B. Alternatively, the bipolar transistors 31 and 41 included in the radio-frequency power-amplifying element 20 in the first example and the bipolar transistors 31 and 41 included in the radio-frequency power-amplifying element 20 in the fifth example may be used in combination. For example, the bipolar transistors 31 in the fifth example may be adopted into the first amplifier circuit 21, and the bipolar transistors 41 in the first example may be adopted into the second amplifier circuit 22.

In the fifth example, the minimum spacing Lbe2 (see FIG. 11B) in each of the bipolar transistors 41 included in the second amplifier circuit 22 is greater than the minimum spacing Lbe1 in each of the bipolar transistors 31 included in the first amplifier circuit 21. Alternatively, the minimum spacing Lbe2 in only some of the bipolar transistors 41 may be greater than the minimum spacing Lbe1. For example, the minimum spacing Lbe2 in specific ones of the bipolar transistors 41 that are less prone to break down during occurrence of an output impedance mismatch may be equal to the minimum spacing Lbe1.

Sixth Example

Figure 13A:
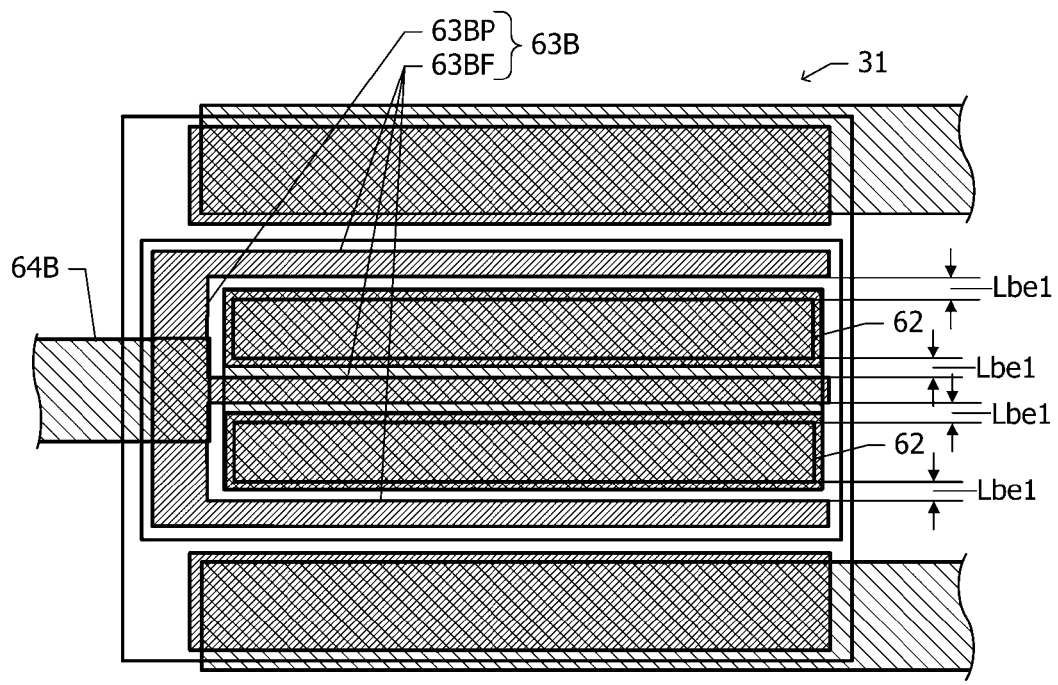
FIG. 13A illustrates a planar layout of constituent components of one of bipolar transistors included in a first amplifier circuit of a radio-frequency power-amplifying element in a sixth example.
Figure 13B:
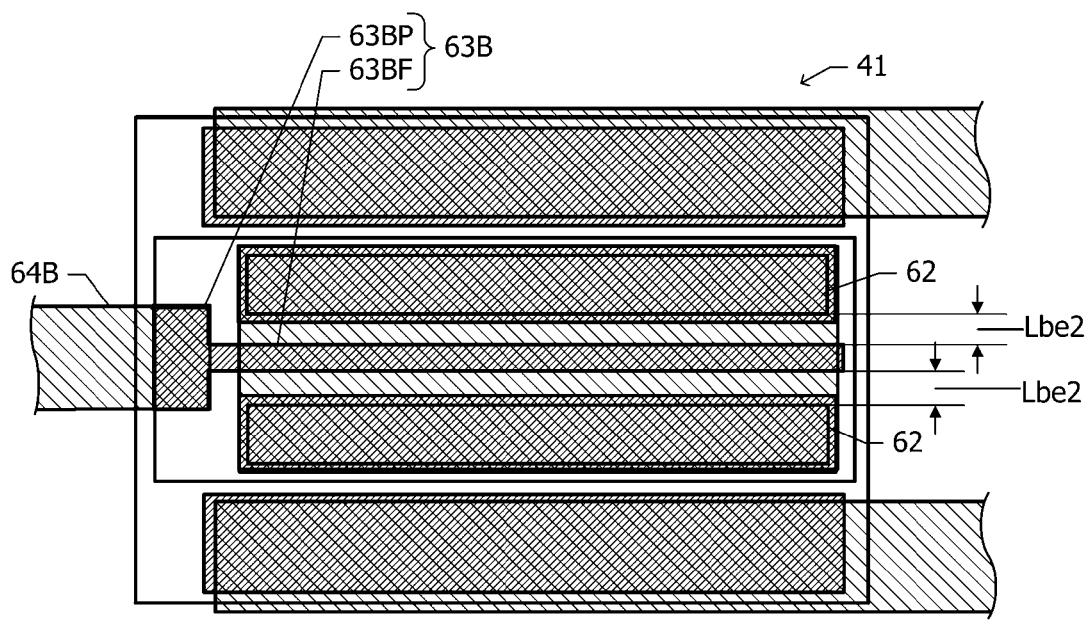
FIG. 13B illustrates a planar layout of constituent components of one of bipolar transistors included in a second amplifier circuit of the radio-frequency power-amplifying element in the sixth example.

The following describes a radio-frequency power-amplifying element in a sixth example with reference to FIGS. 13A and 13B. Configurations common to the radio-frequency power-amplifying element 20 in the fifth example (see FIGS. 11A, 11B, and 12) will not be further elaborated here.

FIG. 13A illustrates a planar layout of constituent components of one of the bipolar transistors 31 included in the first amplifier circuit 21 (see FIG. 10) of the radio-frequency power-amplifying element 20 in the sixth example. FIG. 13B illustrates a planar layout of constituent components of one of the bipolar transistors 41 included in the second amplifier circuit 22 (see FIG. 10) of the radio-frequency power-amplifying element 20 in the sixth example.

The bipolar transistors 31 (see FIG. 11A) of the first amplifier circuit 21 in the fifth example each include the base electrode 63B with one finger portion 63BF, whereas the bipolar transistors 31 of the first amplifier circuit 21 in the sixth example each include the base electrode 63B with three finger portions 63BF. The three finger portions 63BF are long in a direction parallel to the long sides of the emitter mesa layers 62. Adjacent ones of the finger portions 63BF are arranged side by side with the emitter mesa layer 62 therebetween. The three finger portions 63BF are connected to each other via the pad portion 63BP adjoining an end of each of the three finger portions 63BF. The base extended line 64B are connected to the pad portion 63BP.

The three finger portions 63BF and the two emitter mesa layers 62 are spaced with four gap portions defined therebetween. The four gap portions all provide the same minimum spacing Lbe1.

The configuration of the bipolar transistor 41 (see FIG. 13B) included in the second amplifier circuit 22 is identical to the configuration of the bipolar transistor 41 (see FIG. 11B) included in the second amplifier circuit 22 in the fifth example.

The following describes advantageous effects of the sixth example.

In the sixth example, the minimum spacing Lbe2 in the bipolar transistor 41 of the second amplifier circuit 22 is greater than the minimum spacing Lbe1 in the bipolar transistor 31 of the first amplifier circuit 21. In common with the radio-frequency power-amplifying element 20 in first example, the radio-frequency power-amplifying element 20 in the sixth example achieves a high withstand voltage and high gain accordingly.

In either of the fifth and sixth examples, the multilayer structure of the bipolar transistors 31 included in the first amplifier circuit 21 is identical to the multilayer structure of the bipolar transistors 41 included in the second amplifier circuit 22. This configuration adds no further complications and inconveniences to the production processes and enables cost containment.

The base electrodes 63B of the bipolar transistors 31 included in the first amplifier circuit 21 in the sixth example each include three finger portions 63BF, thus reducing the base resistance to a greater extent than would be possible with the configuration in the fifth example. This eliminates or reduces the possibility that the gain of the first amplifier circuit 21 will be reduced due to the base resistance. The gain of the radio-frequency power-amplifying element 20 may be improved accordingly.

The following describes a modification of the sixth example. Instead of including three finger portions 63BF as in the sixth example, each of the base electrode 63B may include four or more finger portions 63BF. It is required that the number of emitter mesa layers 62 be one less than the number of finger portions 63BF.

When each of the emitter mesa layers 62 of the bipolar transistor 41 of the second amplifier circuit 22 is interposed between two finger portions 63BF of the base electrode 63B, the operation of the bipolar transistor 41 is likely to become unstable during high power output due to the disparity between the flow of base current from one of the finger portions 63BF to the emitter mesa layer 62 and the flow of base current from the other finger portion 63BF to the emitter mesa layer 62. A preferred approach to reducing the operational instability requires that one finger portion 63BF be provided for the corresponding emitter mesa layer 62 of the bipolar transistor 41 of the second amplifier circuit 22. Specifically, the number of finger portions 63BF in the bipolar transistor 41 of the second amplifier circuit 22 is preferably less than the number of finger portions 63BF in the bipolar transistor 31 of the first amplifier circuit 21.

Seventh Example

Figure 14A:
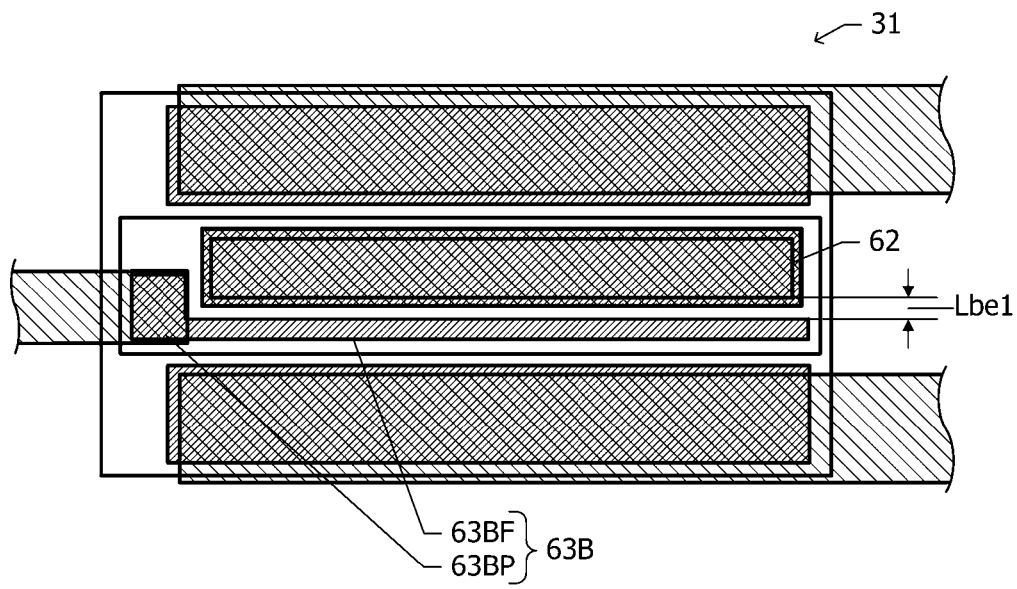
FIG. 14A illustrates a planar layout of constituent components of one of bipolar transistors included in a first amplifier circuit of a radio-frequency power-amplifying element in a seventh example.
Figure 14B:
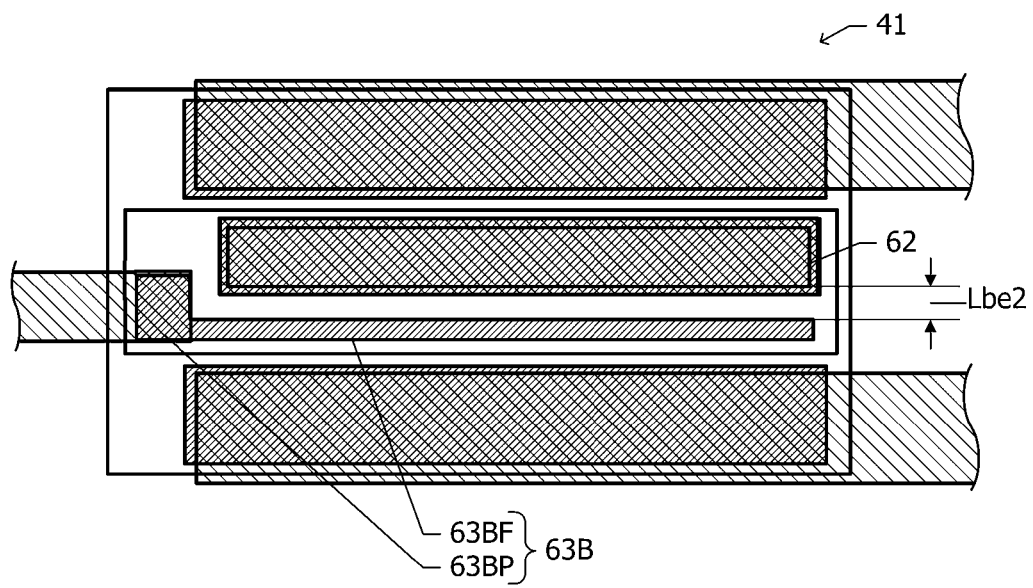
FIG. 14B illustrates a planar layout of constituent components of one of bipolar transistors included in a second amplifier circuit of the radio-frequency power-amplifying element in the seventh example.

The following describes a radio-frequency power-amplifying element in a seventh example with reference to FIGS. 14A and 14B. Configurations common to the radio-frequency power-amplifying element 20 in the fifth example (see FIGS. 11A, 11B, and 12) will not be further elaborated here.

FIG. 14A illustrates a planar layout of constituent components of one of the bipolar transistors 31 included in the first amplifier circuit 21 (see FIG. 10) of the radio-frequency power-amplifying element 20 in the seventh example. FIG. 14B illustrates a planar layout of constituent components of one of the bipolar transistors 41 included in the second amplifier circuit 22 (see FIG. 10) of the radio-frequency power-amplifying element 20 in the seventh example.

The bipolar transistors 31 and 41 in the fifth example each include two emitter mesa layers 62 (see FIGS. 11A and 11B). The seventh example differs from the fifth example in that the bipolar transistors 31 and 41 each include one emitter mesa layer 62. On one side of the emitter mesa layer 62 is the finger portion 63BF of the base electrode 63B.

Lbe2 is greater than Lbe1, where Lbe2 denotes the minimum spacing between the finger portion 63BF of the base electrode 63B and the emitter mesa layer 62 of the bipolar transistor 41 of the second amplifier circuit 22, and Lbe1 denotes the minimum spacing between the finger portion 63BF of the base electrode 63B and the emitter mesa layer 62 of the bipolar transistor 31 of the first amplifier circuit 21.

The following describes advantageous effects of the seventh example.

In the seventh example, the minimum spacing Lbe2 in the bipolar transistor 41 of the second amplifier circuit 22 is greater than the minimum spacing Lbe1 in the bipolar transistor 31 of the first amplifier circuit 21. In common with the radio-frequency power-amplifying element 20 in fifth example, the radio-frequency power-amplifying element 20 in the seventh example achieves a high withstand voltage and high gain accordingly.

In either of the fifth and seventh examples, the multilayer structure of the bipolar transistors 31 included in the first amplifier circuit 21 is identical to the multilayer structure of the bipolar transistors 41 included in the second amplifier circuit 22. This configuration adds no further complications and inconveniences to the production processes and enables cost containment.

The following describes a modification of the seventh example.

The bipolar transistor 41 (see FIG. 14B) in the seventh example may be adopted into the second amplifier circuit 22, and the bipolar transistor 31 (see FIG. 13A) in the sixth example may be adopted into the first amplifier circuit 21. Adopting the bipolar transistor 31 (see FIG. 13A) in the sixth example into the first amplifier circuit 21 is conducive to improving the gain of the first amplifier circuit 21. The gain of the radio-frequency power-amplifying element 20 may be improved accordingly.

These examples are merely illustrative. Needless to say, partial replacements or combinations of configurations illustrated in different examples are possible. Not every example refers to actions and effects caused by similar configurations. Furthermore, the present disclosure is not intended to be limited to the above-described examples. For example, it will be obvious to those skilled in the art that various changes, improvements, combinations, and the like may be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency power-amplifying element, comprising:
   a substrate; and
   a first amplifier circuit and a second amplifier circuit that are disposed on the substrate, wherein
   the first amplifier circuit includes at least one bipolar transistor,
   the second amplifier circuit includes a plurality of bipolar transistors,
   the at least one bipolar transistor of the first amplifier circuit and the plurality of bipolar transistors of the second amplifier circuit each include
   a collector layer on the substrate,
   a base layer on the collector layer,
   an emitter layer on the base layer,
   an emitter mesa layer on the emitter layer,
   an emitter electrode connected to the emitter layer through the emitter mesa layer, and
   a base electrode disposed on the base layer and connected to the base layer,
   the emitter mesa layer and the base electrode of the at least one bipolar transistor of the first amplifier circuit do not overlap each other when viewed in plan,
   the emitter mesa layer and the base electrode of each of the plurality of bipolar transistors of the second amplifier circuit do not overlap each other when viewed in plan, and
   a minimum spacing between the base electrode and the emitter mesa layer of at least one of the plurality of bipolar transistors of the second amplifier circuit is greater than a minimum spacing between the base electrode and the emitter mesa layer of the at least one bipolar transistor of the first amplifier circuit.

2. The radio-frequency power-amplifying element according to claim 1, further comprising a ground external connection terminal, wherein
the emitter electrodes of the plurality of bipolar transistors of the second amplifier circuit are connected to the ground external connection terminal.

3. The radio-frequency power-amplifying element according to claim 1, wherein
the first amplifier circuit includes at least one capacitive element and at least one resistive element that are provided for the at least one bipolar transistor of the first amplifier circuit, and
the second amplifier circuit includes a plurality of capacitive elements and a plurality of resistive elements with each of the plurality of capacitive elements and each of the plurality of resistive elements being provided for a corresponding one of the plurality of bipolar transistors of the second amplifier circuit.

4. The radio-frequency power-amplifying element according to claim 3, wherein
each of the plurality of capacitive elements provided for the respective bipolar transistors of the second amplifier circuit is connected to the base electrode of a corresponding one of the plurality of bipolar transistors of the second amplifier circuit, and
through each of the plurality of capacitive elements of the second amplifier circuit, the base electrode of a corresponding one of the plurality of bipolar transistors of the second amplifier circuit is supplied with a radio-frequency signal output from the first amplifier circuit.

5. The radio-frequency power-amplifying element according to claim 3, wherein
in each of the first and second amplifier circuits, a resistance value of a current path including the base layer between the base electrode and the emitter mesa layer is not more than one-tenth of a resistance value of the resistive element connected to the base electrode.

6. The radio-frequency power-amplifying element according to claim 1, wherein
the base electrode of the at least one bipolar transistor of the first amplifier circuit includes at least one finger portion that is long in one direction, the at least one finger portion including a plurality of finger portions that is connected to each other at one end with the emitter mesa layer being interposed between two adjacent ones of the plurality of finger portions,
the base electrodes of the plurality of bipolar transistors of the second amplifier circuit each include at least one finger portion that is long in one direction, and
the number of finger portions of the base electrode of the at least one bipolar transistor of the first amplifier circuit is more than the number of finger portions of each of the base electrodes of the plurality of bipolar transistors of the second amplifier circuit.

7. The radio-frequency power-amplifying element according to claim 3, further comprising:
a first bias circuit and a second bias circuit that are disposed on the substrate, wherein
the base electrode of the at least one bipolar transistor of the first amplifier circuit is connected to the first bias circuit through the corresponding resistive element of the first amplifier circuit, and
each of the base electrodes of the plurality of bipolar transistors of the second amplifier circuit is connected to the second bias circuit through a corresponding one of the plurality of resistive elements of the second amplifier circuit.

8. The radio-frequency power-amplifying element according to claim 1, wherein
each of the emitter mesa layers and each of the base electrodes in the second amplifier circuit are included in a corresponding one of the plurality of bipolar transistors of the second amplifier circuit.

9. The radio-frequency power-amplifying element according to claim 1, wherein
a multilayer structure of the at least one bipolar transistor of the first amplifier circuit is identical to a multilayer structure of each of the plurality of bipolar transistors of the second amplifier circuit.

10. The radio-frequency power-amplifying element according to claim 1, wherein
when viewed in plan, the emitter mesa layer of each of the plurality of bipolar transistors of the second amplifier circuit is long in one direction and has end portions that are located on opposite sides and are narrower than a portion between the end portions.

* * * * *